United States Patent [19]
Itoh

[11] Patent Number: 4,803,664
[45] Date of Patent: Feb. 7, 1989

[54] DYNAMIC RANDOM ACCESS MEMORY HAVING A GAIN FUNCTION

[75] Inventor: Kiyoo Itoh, Higashikurume, Japan

[73] Assignee: Hitachi, Ltd., Tokyo, Japan

[21] Appl. No.: 31,002

[22] Filed: Mar. 27, 1987

[30] Foreign Application Priority Data

Mar. 28, 1986 [JP] Japan .................................. 61-68326
Jun. 20, 1986 [JP] Japan ................................. 61-143001

[51] Int. Cl.⁴ .............................................. G11C 7/02
[52] U.S. Cl. ..................................... 365/210; 365/189
[58] Field of Search ............... 365/174, 189, 203, 210, 365/230

[56] References Cited

U.S. PATENT DOCUMENTS 4,491,858 1/1985 Kawamoto ..................... 365/210 X

FOREIGN PATENT DOCUMENTS 54-15652 6/1979 Japan .
58-70482 4/1983 Japan .
59-111514 6/1984 Japan .

OTHER PUBLICATIONS

J. A. Karp et al., "A 4096-Bit Dynamic MOS RAM", Digest of Technical Papers, pp. 10-11, 1972, IEEE International Solid-State Circuits Conference.
K. Shimohigashi et al., "Design of a 3-Transistor, 2.5 Line Per-Bit Dynamic MOS RAM", Institute of Electronics and Communication Engineers of Japan, Jun. 1975, vol. 58-C, No. 6, pp. 327-334.

Primary Examiner—Joseph A. Popek
Attorney, Agent, or Firm—Antonelli, Terry & Wands

[57] ABSTRACT

Integration of a dynamic random access memory having a very high integration is further improved according to the invention. A memory structure is disclosed wherein a three transistor type memory cell is used instead of a conventional 1T-1C memory cell, and data read and write terminals are connected to a pair of data lines in such a manner that the electrical characteristics of the pair of data lines are balanced. A three transistor type memory cell is realized which is capable of operating at high speed and with high reliability.

42 Claims, 18 Drawing Sheets

FIG. IA
PRIOR ART
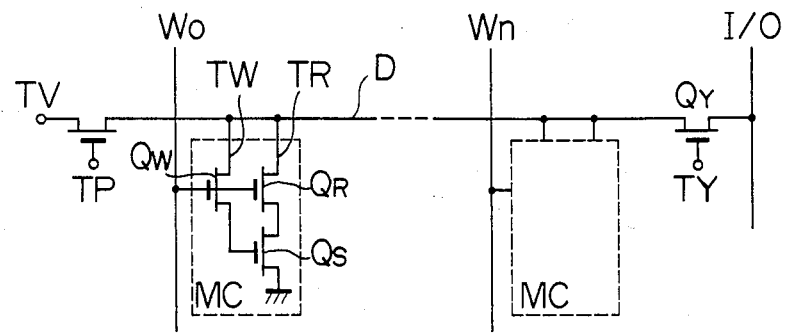
FIG. IB
PRIOR ART
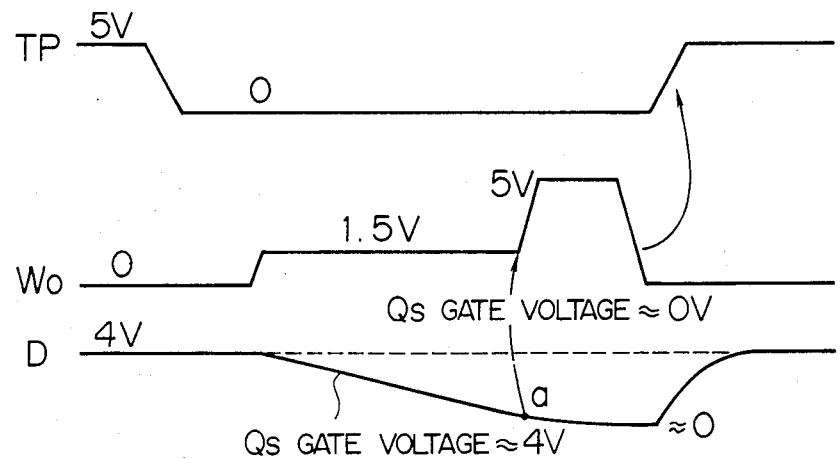

FIG. IIC
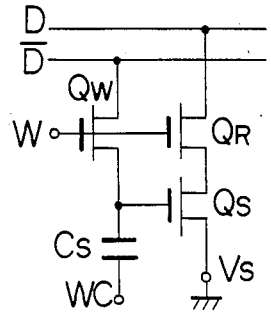
FIG. IID
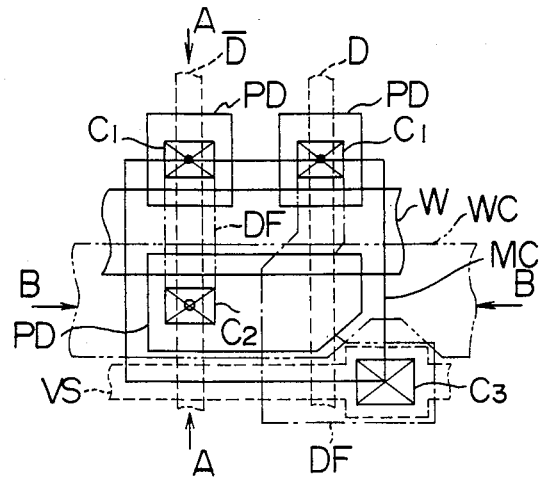
FIG. IIE
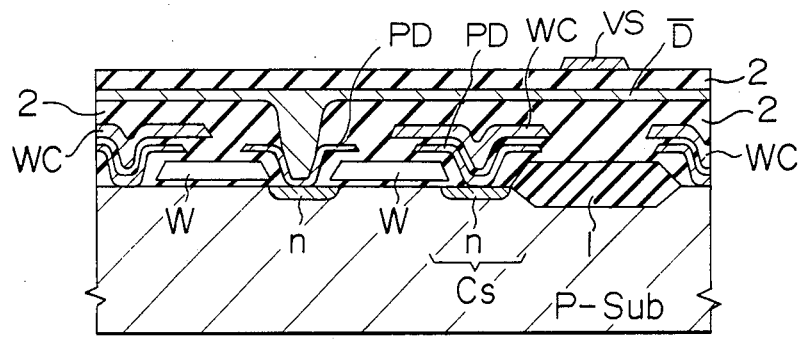
FIG. IIF
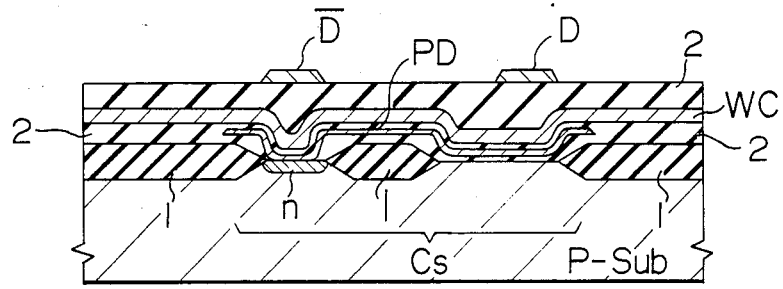

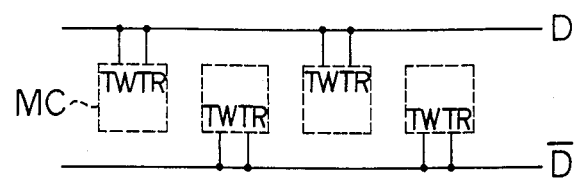
F I G. 17A
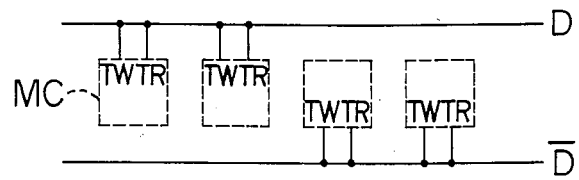
F I G. 17B
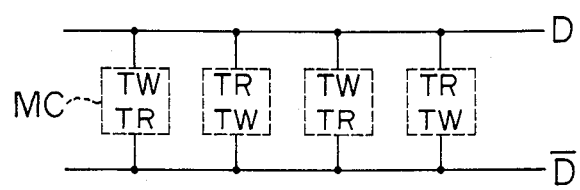
F I G. 17C
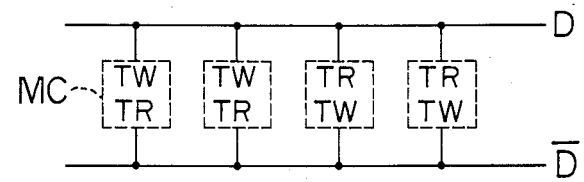
F I G. 17D
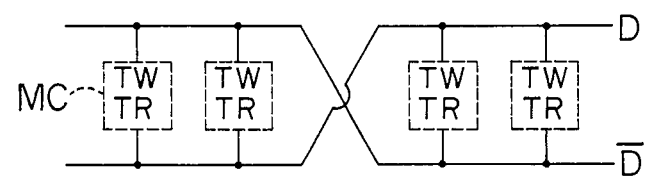
F I G. 17E
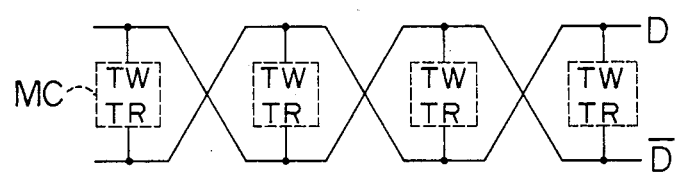
F I G. 17F

DYNAMIC RANDOM ACCESS MEMORY HAVING A GAIN FUNCTION

BACKGROUND OF THE INVENTION

The present invention relates to a dynamic random access memory, and more particularly to the memory cell structure, arrangement, driving scheme and sensing scheme of a dynamic memory having high speed, high density, low power dissipation and high signal to noise ratio.

A conventional dynamic memory (hereinafter referred to as DRAM) has been mainly a so-called one transistor (hereinafter referred to as 1T) cell composed of one transistor and one capacitor. However, since 1T cell has no function of amplification within the cell, the capacitance of a capacitor within the cell must be made larger as the cell integration and size become large, thereby complicating the cell structure and making its manufacture more difficult. For this reason, it has become necessary for future high integration of DRAMs to reconsider a memory cell having amplification function, such as a 3-transistor (3T) cell. However, a conventional 3T cell has still many problems to be solved, for example, low speed operation, high power dissipation, high noise or low integration.

In order to explain these problems, an example of a 3T cell having a smallest cell size among known 3T cells is shown in FIG. 1A. The operation of this 3T cell is detailed in Digest of Technical Papers, p. 10, 1972 IEEE International Solid-State Circuits Conference, and in the paper of the Institute of Electronics and Communication Engineers of Japan, June 1975, Vol. 58-C, No. 6, P. 327. The operation will be briefly described with reference to FIGS. 1A and 1B.

Symbols used in FIG. 1A have the following meanings:
MC: memory cell,
TW: write terminal of memory cell,
TR: read terminal of memory cell,
$W_o$, $W_n$: word line,
D: data line,
I/O: common data line,
TY: Y select line,
TV: power supply terminal for precharge
TP: precharge terminal,
$Q_W$: write transistor,
$Q_R$: read transistor,
$Q_S$: store transistor,
$Q_Y$: Y select transistor.

Transistors are assumed hereinafter N-channel MOS transistors unless specifically indicated otherwise. A memory cell MC is composed of a write transistor $Q_W$, a store transistor $Q_S$, a read transistor $Q_R$; and other necessary circuitries. The operation of the memory cell is performed as in the following. First, a pulse of 5V is applied to the gate terminal TP of a precharge transistor to precharge the data line to 4V from the power supply terminal TV to which 5V is applied. The threshold voltage of transistor is here assumed 1V. After TP terminal becomes 0V and the data line becomes floating state, a pulse voltage of 1.5V is applied to a selected word line $W_o$. If the gate voltage of $Q_S$ is 4V corresponding to stored information "1", $Q_S$ and $Q_R$ become turned on so that the data line voltage is discharged toward 0V. On the other hand, if the gate voltage is 0V corresponding to stored information "0", $Q_S$ is cut off so that the data line voltage remains 4V. These data voltages are outputted to an I/O line, when a select signal from Y decoder is applied to TY, and to the external of the chip as a data output. The write operation starts when the word voltage is made 5V after the above-described read operation has been suitably completed, e.g., at point a in FIG. 1B. Particularly, write information of 4V or 0V inputted to data line D from I/O line is written in as the gate voltage of $Q_S$ because the word voltage is 5V. In the other memory cells unnecessary for writing information on the selected word line $W_o$, corresponding voltages on their data lines are rewritten as they are.

SUMMARY OF THE INVENTION

Problems encountered in such conventional cells can be summarized as in the following.

(1) Increase of power dissipation and peak current resulting from charge/discharge of data lines of large size cells becomes serious. To solve this problem, it is necessary to divide a single data line in multiplicity to effectively practically shorten the data line and reduce parasitic capacitance, or to lower the voltage of the data line. The method of multi-dividing a data line, however, requires additional control circuits to thereby increase the chip size. With the method of lowering the data line voltage, since the voltage stored in the memory cell is directly determined by the data line voltage, it becomes low so that soft error-immunity of a memory cell is considerably deteriorated to result in a low reliability.

(2) The memory cell size should be small for high integration so that the size of transistors $Q_R$ and $Q_S$ should also be made small. Consequently, there is a limit of the driving capability of transistors $Q_R$ and $Q_S$ for discharging the data line D, so that the data line D whose parasitic capacitance increases with high integration cannot be discharged at high speed. It becomes serious particularly in the case of a 3T cell shown in FIG. 1A where a low word voltage such as 1.5V is applied during read operation.

(3) When writing a high level voltage (4V) in a memory cell, current flows through an unrepresented drive transistor in the output stage connected to I/O line and through transistors $Q_Y$, $Q_R$ and $Q_S$, i.e., a so-called ratio operation is carried out, thus increasing power dissipation. Further, the voltage margin of the memory cell MC is lowered because the high level voltage to the gate of transistor $Q_S$ is lowered. Furthermore, there also arises a problem associated with memory cell MC during the rewrite operation. Namely, since the data line voltage to be read is in the floating state at 4V when the gate voltage of transistor $Q_S$ is 0V, the voltage of 4V is directly written to the memory cell gate when the word line becomes 5V. In this case also, current flows through transistors $Q_R$ and $Q_S$ so that a lower voltage than 4V is rewritten. In other words, the voltage margin of the memory cell under rewrite operation is lowered.

(4) As apparent from the above-described operation, every time a certain memory cell is rewritten, the gate voltage of transistor $Q_S$ is reversed between high and low. Thus, a memory test becomes complicated so that logics for counting the number of rewrite operations are required to be included within the same chip, which leads to a complicated circuit design.

(5) A plurality of data lines charge or discharge between 0V and 4V during reading or precharging so that excessive noises are introduced via various coupling capacitances within the array. For instance, a non-selected word line voltage varies so that the stored charge leaks to the data line through memory cell transistor $Q_W$ connected thereto. Further, since the voltage variation between charge/discharge is as large as 4V, power dissipation increases.

According to the present invention, in a memory cell such as a 3T cell having data read and write terminals, the terminals are connected to a pair of data lines in a manner wherein the electrical characteristics of the pair of data lines becomes generally balanced.

As a result, a small read signal from a memory cell can be detected at high speed with a differential sense amplifier, and a write operation can be carried out differentially, thereby ensuring stable operation.

Further, according to the present invention, in a memory cell having a gain (function of amplification) within the cell, a capacitor whose one electrode is controlled by a pulse voltage is added at the charge store portion of the cell, to thereby make the store voltage in the memory cell higher than the data line voltage. Further, the pair of data lines are coupled within the memory cell so as to balance the electrical characteristics thereof, the data lines are precharged at a middle or average value between the operative voltages, and a signal voltage read from the memory cell via one of the data lines is differentially amplified (sense-amplified) with reference to a voltage on the other data line.

Principally, a plurality of memory cells can be connected to a single data line because of the function of amplification of a memory cell. As a result, an additional control circuit for multi-dividing a data line is not needed here in order to enable a small chip size. Meanwhile, connection of a plurality of memory cells to a data line causes large parasitic capacitance of the data line. Therefore, as described previously, there arises the problem of increase of power dissipation or peak current, or low speed operation. However, the increase of power dissipation and peak current can be eliminated since the voltage amplitude on the data line can be set low without deteriorating the stable store characteristic of a memory cell. Further, high speed operation is possible since read and write operations can be carried out just in a differential mode using the pair of data lines. Furthermore, since the pair of data lines is used and the precharge voltage of the lines is set at a half of the voltages of the lines, low power dissipation and low noise can be realized.

An object of the present invention is to provide a memory capable of high integration.

Another object of the present invention is to provide a memory capable of high speed operation.

A further object of the present invention is to provide a memory capable of operating with low power dissipation.

A still further object of the present invention is to provide a memory of high reliability.

Another object of the present invention is to provide a memory of large capacity with simple circuit configuration.

These and other objects and many of the attendant advantages of this invention will be readily appreciated as the same becomes better understood by reference to the following detailed description when considered in connection with the accompanying drawings.

BRIEF DESCRIPTION OF THE DRAWINGS

FIGS. 1A and 1B are views illustrating a conventional 3 transistor memory cell.

FIGS. 17A to 17F are views for illustrating a sixth embodiment of the present invention.

DESCRIPTION OF THE PREFERRED EMBODIMENTS

The embodiments of the present invention will now be described with reference to the accompanying drawings.

FIRST EMBODIMENT

Figure 2A:
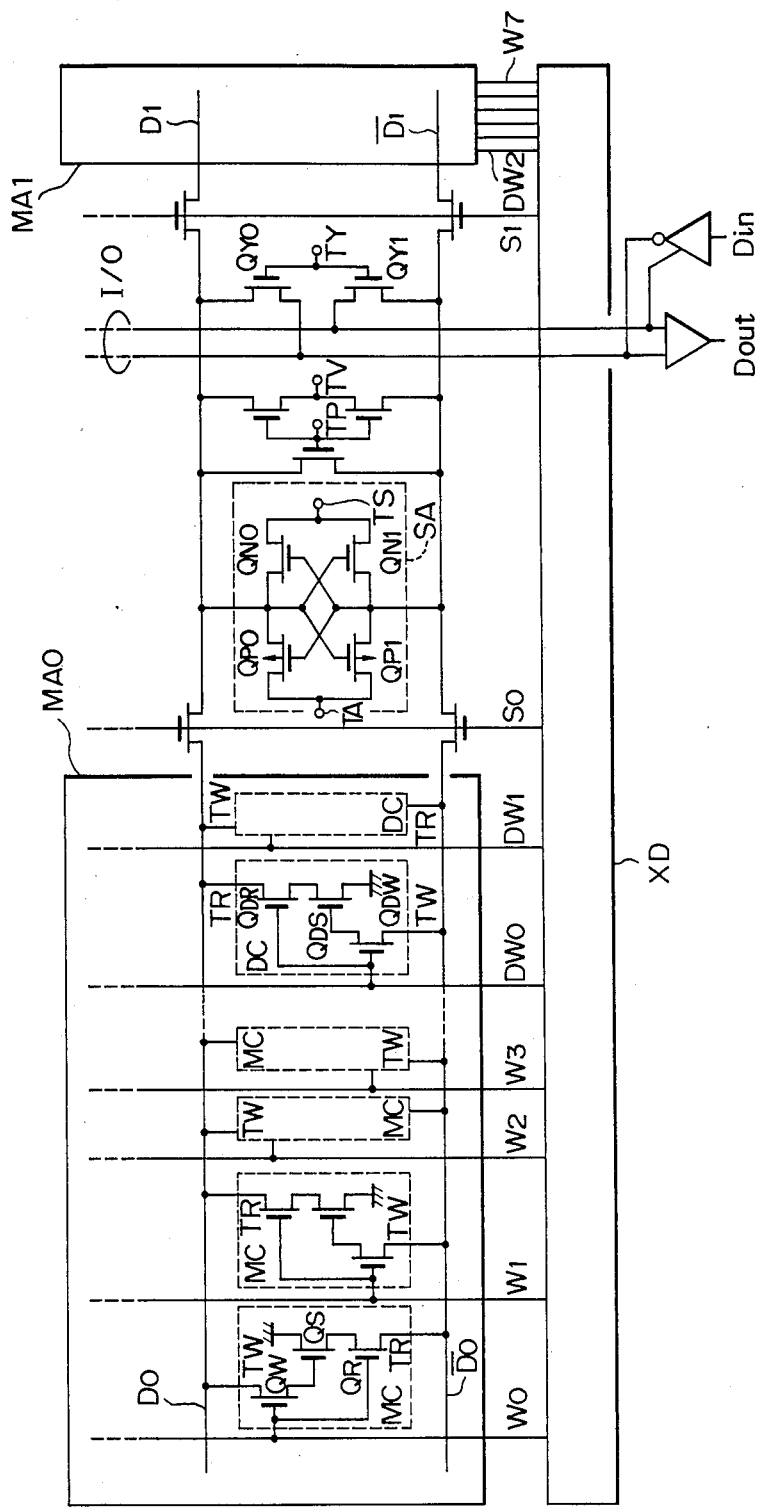
FIGS. 2A to 6 are views for illustrating a first embodiment of the present invention.
Figure 2B:
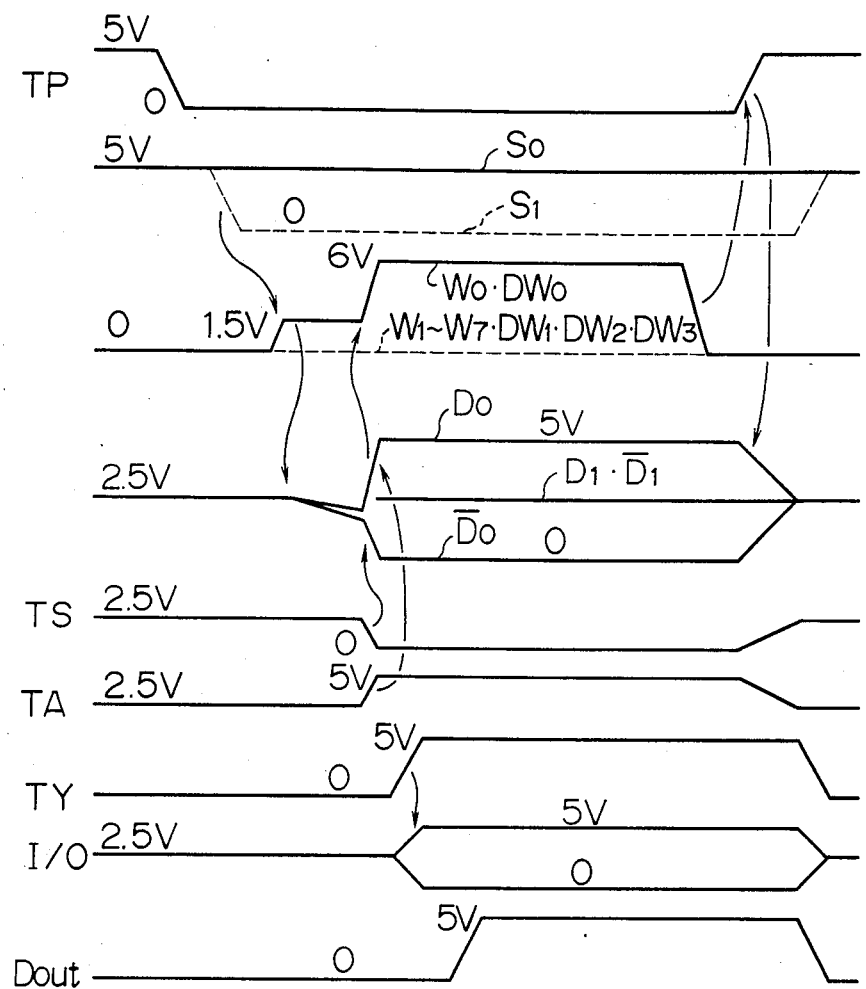

FIGS. 2A and 2B show the first embodiment of the present invention. Symbols used in FIG. 2A have the following meanings:

MA0, MA1: memory array,
XD: X decoder/driver,
$W_o$ to $W_7$: word line (X line),
$DW_o$ to $DW_2$: dummy word line,
$S_o$, $S_1$: memory array selection switch,
SA: sense amplifier and active restore,
$Q_N$: N-channel transistor constituting sense amplifier,
$Q_P$: P-channel transistor constituting active restore,
MC: memory cell,
DC: dummy cell,
$D_o$, $\overline{D}_o$: pair of data lines,
$D_1$, $\overline{D}_1$: pair of data lines,
TS: sense amplifier activation terminal,
TA: active restore activation terminal,
$Q_{DR}$: dummy cell read transistor,
$Q_{DW}$: dummy cell write transistor,
$Q_{DS}$: dummy cell store transistor,
TP: precharge terminal,
TV: power supply terminal,
TY: Y select terminal,
I/O: data input/output terminal,
QW: write transistor,
$Q_S$: store transistor,
$Q_R$: read transistor,
TW: memory cell write terminal,
TR: memory cell read terminal.

The aspects of this embodiment resides in:

(1) A plurality of 3T memory cells MCs are connected in such a manner that the parasitic capacitances of pairs of data lines (e.g., a pair of $D_o$, $\overline{D}_o$) are made balanced. In the Figure, read and write terminals TR and TW are separately connected in a cell to the pair of data lines. In addition, in view of fact that the electrical characteristics of TR and TW are not necessarily the same, the read and write terminals TR and TW are alternately connected relative to a same pair of data lines. Each pair of data lines is provided with a differential sense amplifier SA in common with MCs. A signal voltage of MC read from one of the pair of data lines is amplified by sense amplifier SA using as a reference voltage the voltage on the other of the pair of data lines. If sense amplifier SA has a sufficient sensitivity, it becomes unnecessary to read a MC for a long time as shown in FIG. 1B, but a small read signal voltage can be amplified by the sense amplifier when it appears on the data line, thus correspondingly realizing high speed. As a means for generating a reference voltage, a dummy cell DC is provided.

(2) Since the sense amplifier is constructed as a flip-flop composed of N-channel and P-channel transistors, the voltage levels on the pair of data lines are by all means in opposite phase at a fixed level. Therefore, current through transistors $Q_R$ and $Q_S$ during writing does not flow because the read and write terminals are separately connected to the pair of data lines as shown in FIG. 2A, thus ensuring low power dissipation. In addition, since the data lines are not in floating state as in the conventional approach, a sufficient voltage level can be rewritten.

(3) The gate voltage of $Q_S$ is not reversed during reading and rewriting. This is because of separate connection of the read and write terminals to the pair of data lines.

(4) Since the precharge voltage of the data lines is at a level almost half way between the high and low write voltages to the memory cell, the voltage level for simultaneous charge/discharge becomes about half that of the conventional one, thereby making the power dissipation during charge/discharge of the data lines about half that of the conventional one. Further, by arranging the charge/discharge of the pair of data lines to be carried out substantially at the same time, it is possible to cancel out coupling voltage to other conductors such as word lines and silicon substrate to thereby realize low noise.

(5) In the circuit arrangement, wherein a pair of data lines is divided into two portions, i.e., $D_o$ and $\overline{D}_o$, $D_1$ and $\overline{D}_1$ to arrange at the middle therebetween the sense amplifier and the circuits related to precharge, a subarray belonging to one of the pair of data lines is selected to reduce by half the parasitic capacitance associated with the charge/discharge of the pair of data lines, to thereby further reduce power dissipation. In the following, the embodiment will be further described in detail with reference to the timing chart shown in FIG. 2B.

Assume now that a word line $W_o$ and the memory cell connected thereto have been selected. When a precharge signal having been applied to precharge terminal TP becomes turned off from 5V to 0V, each data line is precharged to 2.5V which is the voltage at precharge power supply terminal TV and thereafter, attains the floating state. Then, a selection signal $S_o$ at the memory sub-array side MA to be selected is maintained on, while the selection signal $S_1$ not to be selected is turned off. After a voltage of 1.5V is applied to word line $W_o$ and dummy word line $DW_o$, a read operation starts. The word line voltage is regulated to a low value for the following reason. Namely, since the word line voltage is applied also to the gate of transistor $Q_W$, it is necessary to suppress a rise in the gate voltage of $Q_S$ which should essentially be 0V but instead will rise due to a current flowing from the data line $D_o$ via $Q_W$ when the gate voltage of store transistor $Q_S$ is 0V (information "0"). Assume that the threshold voltage $V_T$ of transistor is 1V. If the word voltage is 1.5V, the gate voltage of $Q_S$ will rise from 0V to 0.5V ($1.5V - V_T$). However, in this case, there is no fear of turning-on of $Q_S$ during a read operation because $V_t$ of $Q_S$ is also 1V. After the word voltage is applied as described above, and in case where the gate voltage of $Q_S$ in memory cell MC is 5V (information "1"), the data line $\overline{D}_o$ discharges toward 0V because $Q_S$ and $Q_R$ turn on, while the data line $D_o$ also discharge by means of dummy cell DC to be described later. If the discharge speed by DC is set slower than that by MC using a means to be described later, a differential voltage between data lines $D_o$ and $\overline{D}_o$ is produced which is inputted to sense amplifier SA. Thereafter, the flip-flop composed of N-channel transistors $Q_{No}$ and $Q_{N1}$ and amplifying in the discharge direction and the flip-flop composed of P-channel transistors $Q_P$ and $Q_P$ and amplifying in the charge direction are activated upon application of pulses TS and TA. Thus, sense amplifier SA operates to discharge $D_o$ from about 2.5V to 0V, and to charge $D_o$ from about 2.5V to 5V. The amplified differential signal is differentially outputted upon Y selection (pulse application to TY) to I/O line to obtain a data output Dout. Similarly, to read 0V (information "0") of the gate voltage of $Q_S$ of memory cell MC, data line $\overline{D}_o$ is maintained 2.5V because of a cut-off state of $Q_S$, while data line $D_o$ discharges by means of dummy cell DC in the manner as described previously. Since the obtained differential signal is opposite in phase to that during reading "1", thus sense amplifier SA can correctly discriminate and amplify this signal. As above, by setting the discharge waveform of the data line by means of dummy cell DC at between two waveforms (a discharge waveform in case of "1", and a constant voltage of 2.5V in case of "0") of the data lines associated with the stored information in memory cell MC (idealistically at the midpoint waveform), sense amplifier SA can correctly amplify the differential signal corresponding to the stored information and produce a data output. The above operation is not possible unless the electrical characteristics of the pair of data lines, particularly of the parasitic capacitances of the pair of data lines, are maintained balanced. The reason for this is that although memory cell MC has a function of amplification, a small signal prior to sufficient amplification of the differential signal on the data lines is amplified at high speed by sense amplifier SA. To correctly detect the polarity of a small, differential signal corresponding to the stored information and amplify the signal, it is more desirable that the parasitic capacitances of the pair of data lines, which is a capacitive load when seen from the sense amplifier, be more completely balanced. To realize such balance, read and write terminals TR and TW are separately connected to the pair of data lines as shown in FIG. 2A, as compared with a conventional circuit interconnection within a memory cell (FIG. 1A). Further, according to the aspect of this embodiment, since terminals TR and TW may have different characteristics, such as parasitic capacitance, the terminals connected to the pair of data lines are alternately changed for each memory cell to balance the parasitic capacitances of the pair of data lines.

A write operation is carried out by raising the word voltage to more than 5V when the amplification by the sense amplifier is completed. A differential voltage is forcibly applied to I/O line in accordance with a data input Din. In accordance with the selected Y selection transistors $Q_{Yo}$ and $Q_{Y1}$, the flip-flops in sense amplifier SA are set. As a result, one of the differential voltages 0V and 5V appearing on the pair of data lines $D_o$ and $\overline{D}_o$ is inputted to the gate of $Q_S$ via $Q_W$ of memory chip MC to complete the write operation. Since the word voltage is more than 6V and the $V_T$ of $Q_W$ is 1V, 5V on the data line itself becomes the gate voltage of $Q_S$. If $D_o$ is at 5V, $\overline{D}_o$ is at 0V. Therefore, current does not flow through $Q_S$ and $Q_R$ as in the conventional memory cell. On the other hand, even if $D_o$ is 0V and $\overline{D}_o$ is 5V, current does not flow through $Q_S$ and $Q_R$ because of a cut-off of $Q_S$, thus ensuring low power dissipation. This advantageous effect is originated because the read and write terminals are separately connected to the pair of data lines operating differentially. The other memory cells on word line $W_o$ must be rewritten, and this rewrite operation can be effected by inputting the voltage level amplified by the sense amplifier, at the time the word line is raised to more than 6V, to the gates of the memory cells $Q_S$. Similarly, it is obvious that when another word line, for example word line $W_1$, is selected, read and write operations can be effected selecting dummy word line $DW_1$.

Figure 3A:
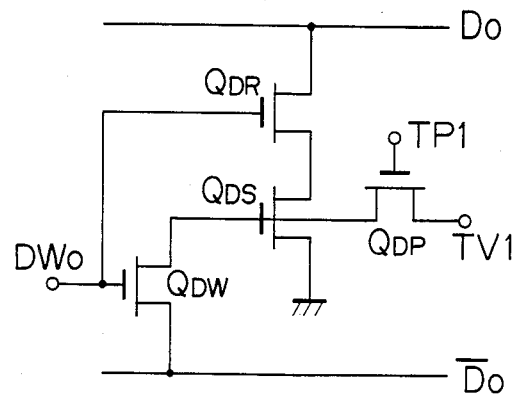

FIG. 3A shows an example of a dummy cell and its driving method, wherein a voltage waveform of the dummy cell is set at between two voltage waveforms respectively corresponding to stored information "1" and "0" appearing on the pair of data lines during a read operation. Although the concept of a dummy cell is shown in FIG. 2A, the following embodiment may be adopted for a practical dummy cell. FIG. 3A shows an example of a dummy cell wherein transistor $Q_{DP}$ for supplying a precharge voltage is provided within the dummy cell shown in FIG. 2A. Symbols used in FIG. 3A have the following meanings:

$D_o$, $\overline{D}_o$: pair of data lines,
$Q_{DR}$: dummy cell read transistor,
$Q_{DW}$: dummy cell write transistor,
$Q_{DS}$: dummy cell store transistor,
$DW_o$: dummy word line,
TP1: precharge terminal,
TV1: precharge power supply terminal,
$Q_{DP}$ precharge transistor.

Figure 3B:
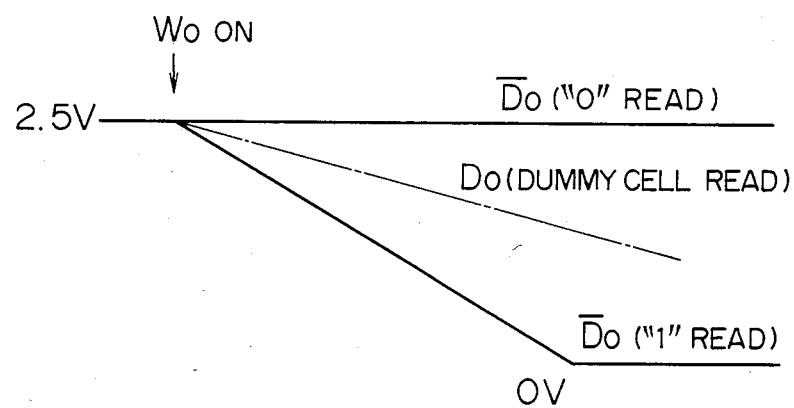

As described previously, when a read or write operation is completed, 5V or 0V is rewritten or written to a selected memory cell. In this case, a voltage opposite in polarity to that of the memory cell is written in the dummy cell at the same time. The voltage to be written to the dummy cell is not always constant so long as a random access memory is used. However, it is necessary to always output a constant voltage waveform onto the data lines during a read operation. Thus, it becomes necessary to set the gate voltage of $Q_{DS}$ prior to the reading operation to a constant voltage. This is accomplished by turning on $Q_{DS}$ through terminal TP1 during the precharge period to supply a certain constant voltage from terminal TV1 to store transistor $Q_{DS}$ of the dummy cell. For example, assume that the constant voltage is set at 2.5V which is a middle value between 0V and 5V of the gate voltages of $Q_S$ of the memory cell corresponding to $Q_{DS}$. Then, it is possible to set the data line waveform outputted to the data lines at between the data waveforms read from the memory cell if the sizes of dummy cell transistors are made substantially the same as those of corresponding memory cell transistors. This is illustrated in FIG. 3B wherein it is assumed that the sense amplifier is being turned off to emphasize the mutual relationship between data waveforms of the memory cell and the dummy cell. Obviously, the read waveform of the dummy cell can be controlled as desired by varying the amplitude of the constant voltage to be supplied from TV1 or by changing the size of transistor $Q_{DR}$ to change the conductance thereof. In the foregoing description, the threshold voltage $V_T$ of transistor has been assumed as constant, however $V_T$ of each transistor may be selectively changed to change its driving capability or conductance so as to achieve specific purpose. For example, the mutual relationship between data line voltage waveforms of the memory cell and the dummy cell can be controlled by setting $V_T$ of transistor in the dummy cell at a different value from the threshold voltage of the corresponding transistor in the memory cell, or by setting $V_T$ of transistors in the memory cell or the dummy cell at a different relative values.

In the above embodiment, dummy cells are provided for each sub-array MA0 or MA1. However, in some cases, dummy cells may be arranged in the sense amplifier SA region to be used in common with both the sub-arrays MA0 and MA1, to thereby reduce the chip size.

Further, in FIG. 2A, the sense amplifier has been constructed of N-channel and P-channel MOS transistors. However, the sense amplifier may be constructed of only P-channel MOS transistors $Q_{P0}$ and $Q_{P1}$. Particularly, $Q_{N0}$ and $Q_{N1}$ may be omitted if the layout area of sense amplifier SA is too large to be included within the memory cell layout pitch. The reason for this is that the memory cell and the dummy cell have also the function of amplifying the data line, i.e., function of discharging. Namely, when the flip-flop composed of $Q_{P0}$ and $Q_{P1}$ is turned on upon application of a pulse to TA after a small voltage signal is read onto the pair of data lines, the high voltage side data line $D_o$ or $\overline{D}_o$ is charged from 2.5V to 5V by the sense amplifier, while the low voltage side data line $D_o$ or $\overline{D}_o$ is discharged from about 2.5V to 0V by the memory cell or the dummy cell.

In the memory cell shown in FIG. 2A, the relationship between the word voltage (1.5V in FIG. 2A) during a read operation and the threshold voltage $V_T$ of transistor, particularly transistor $Q_W$, is very important with respect to the cell performance. If $V_T$ of $Q_W$ is selectively made high in a conventional memory cell of FIG. 1A, the gate voltage of $Q_R$ can be made high correspondingly thus enabling high performance. This is already known in JP-B-54-15652. Similarly, high performance can be achieved by incorporating this concept to $Q_W$ of the cell of FIG. 2A. If the substrate surface under the gate of $Q_W$, including the n-layer connection regions (FIGS. 4 and 5 described later) of $Q_W$ and $Q_S$, is selectively made high in density, for example, by implanting ion such as boron, $V_T$ of $Q_W$ can be selectively made high and the soft error due to alpha rays can be suppressed to a low level. Further, in the memory cell shown in FIG. 1A, it is important how to control a difference voltage, between the word voltage during a read operation and $V_T$ of transistors constituting the memory cell, at a constant voltage. This is detailed in the paper of the Institute of Electronics and Communication Engineers of Japan, June, 1975, Vol. 58-C, No. 6, pp. 237 to 334. In this case, a word voltage may be generated by a read word voltage power supply provided within the chip which is not influenced by the external power supply, to thereby obtain a constant read word voltage. This read word voltage power supply is a kind of a voltage limiter circuit whose output voltage, i.e., a word voltage, is preferably compensated for a change of $V_T$ due to manufacture spread, so that a difference between the read word voltage and $V_T$ becomes substantially constant irrespective of a change of the external power supply and manufacture spread thereby enabling high performance. Such a voltage limiter circuit is detailed in JP-A-58-70482 and JP-A-59-111514.

Figure 4:
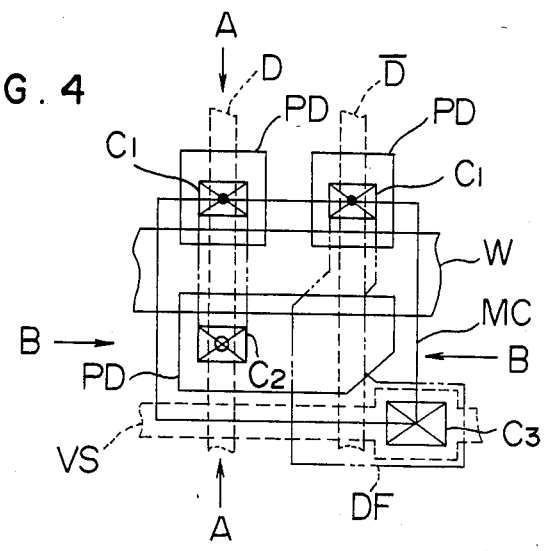

FIG. 4 is a plan view of the memory cell shown in FIG. 2A.

Symbols used in FIG. 4 have the following meanings:
MC: plan view corresponding to one memory cell,
D, $\bar{D}$: pair of data lines,
W: word line,
PD: pad,
DF: active region,
VS: earth (ground) line,
C1: contact for connecting n-layer and PD, and PD and D, D,
C2: contact for connecting n-layer and PD,
C3: contact for connecting n-layer and VS.

Figure 5A:
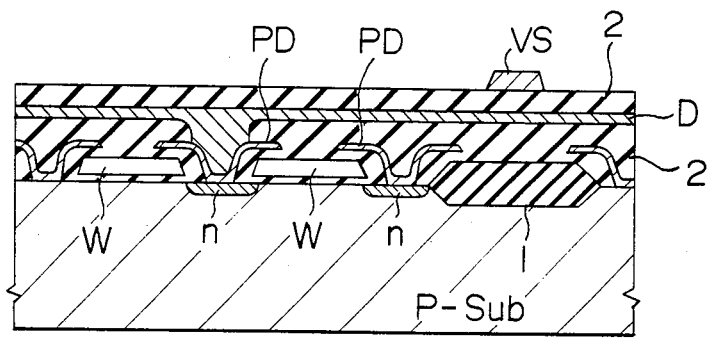
Figure 5B:
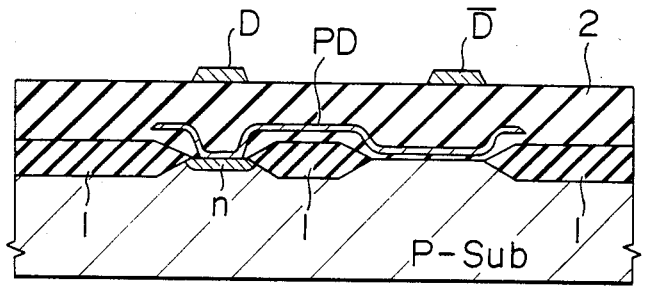

FIG. 5A is a cross section along A—A of FIG. 4, and FIG. 5B is a cross section along B—B of FIG. 4.
Symbols used in FIGS. 5A and 5B have the following meanings:
D, $\bar{D}$: pair of data lines,
W: word line,
VS: earth (ground) line,
1: isolation/insulation layer,
2: insulation layer,
PD: pad.

Pad PD is provided at the contact portion between data line D, $\bar{D}$ and n-type impurity region to improve the reliability. Namely, aluminum diffusion into the n-type impurity region is prevented if the data line is made of aluminum.

Figure 6:
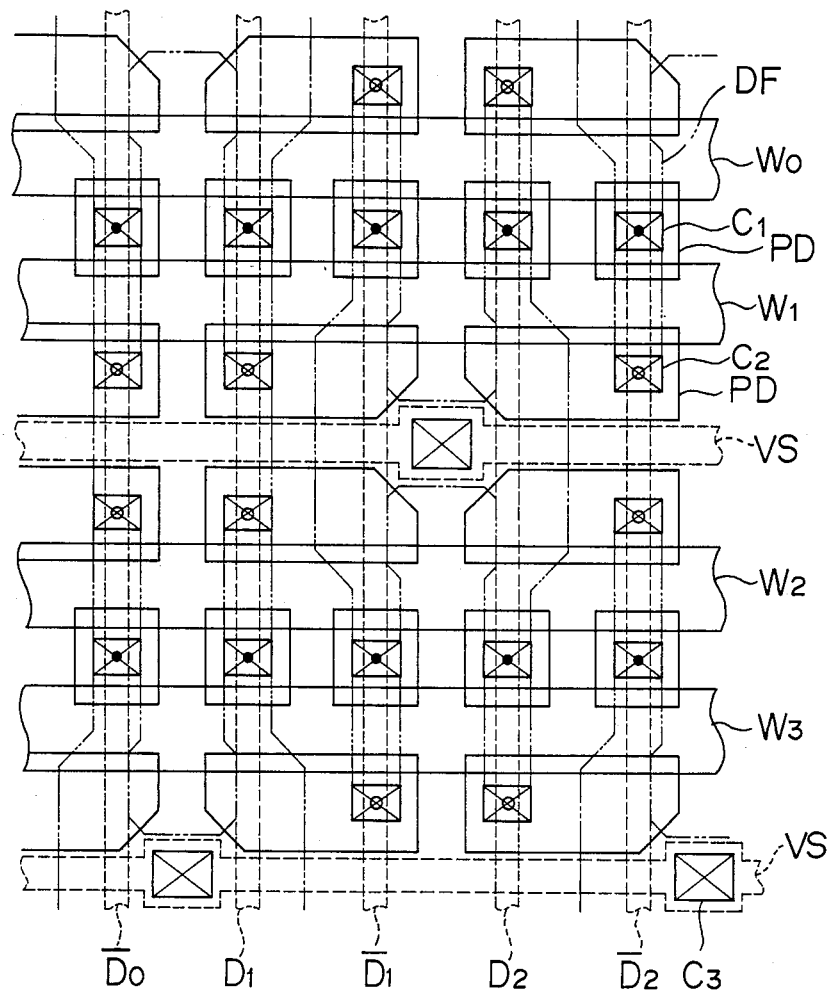

FIG. 6 is a plan view showing interconnection between cells (using the example shown in FIG. 11(d)).

Referring to FIGS. 4, 5A, 5B and 6, word line W is made of silicide or polycide containing polysilicon, molybdenum, or tungsten. Data line D is made of silicide or alminum. The data line and the n-layer outside of the memory cell is interconnected using PD made of polysilicon or the like. Ground line VS made of aluminum or silicide is connected to the n-layer at contact C3 portion.

SECOND EMBODIMENT

Figure 7A:
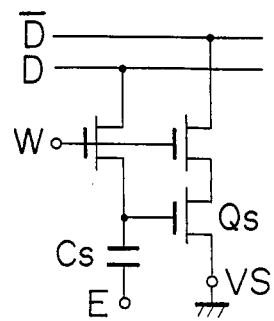
FIGS. 7A to 7C are views for illustrating a second embodiment of the present invention.
Figure 7B:
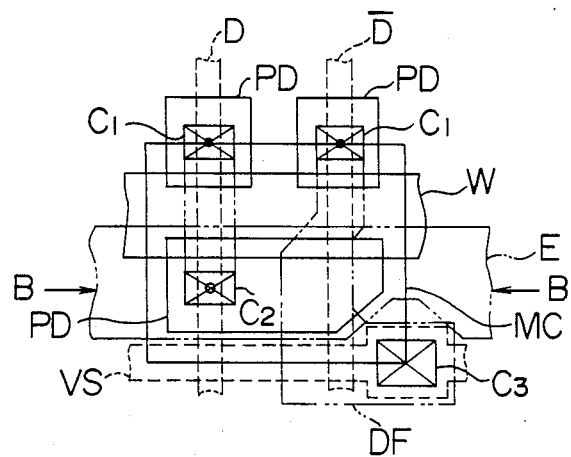
Figure 7C:
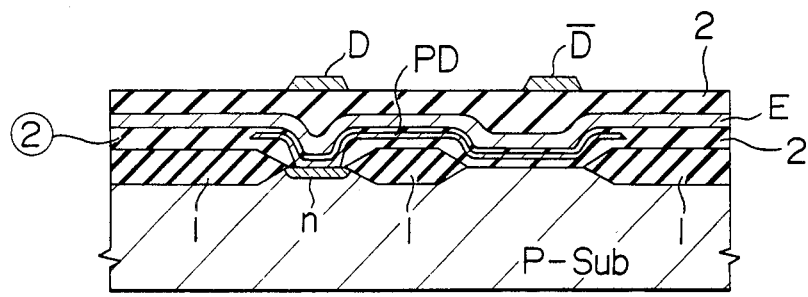

FIGS. 7A, 7B and 7C illustrate the structure of a memory cell having a store capacitor $C_S$ at the store node to make durable against soft error due to alpha particles. FIG. 7A is a circuit diagram wherein one end of $C_S$ is made connectable, FIG. 7B is the plan view of the memory cell and FIG. 7C is the cross section.

In FIGS. 7A, 7B and 7C, D, $\bar{D}$ represent a data line, W a word line, $C_S$ a store capacitor, and E an electrode.

Store capacitor $C_S$ is formed in the region just above PD. As one application of this invention, if electrode E is applied with a 2.5V power supply which is a middle value between 5V and 0V to be stored as store information in transistor $Q_S$ through its gate, then the voltage applied across the electrodes of store capacitor $C_S$ becomes 2.5V which is half of that when 0V or 5V is applied to electrode E. Therefore, the insulation layer forming $C_S$ can be thinned correspondingly and the capacitance can be made large without compromising with the dielectric strength. The insulation layer for forming $C_S$ in FIGS. 7A and 7C may use a thermal oxidized layer, a nitride layer, a tantalum pentoxide layer or a multilayer thereof. Electrode E may use tungsten, silicide or polysilicon.

THIRD EMBODIMENT

FIGS. 8A, 8B, 8C and 8D illustrate another bodiment wherein E and VS are connected in common in FIGS. 7A, 7B and 7C.

Figure 8A:
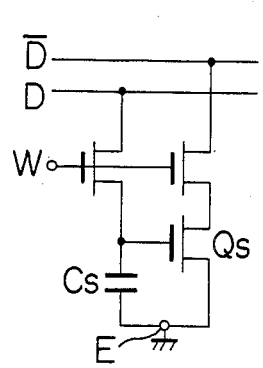
FIGS. 8A to 8D are views for illustrating a third embodiment of the present invention.
Figure 8B:
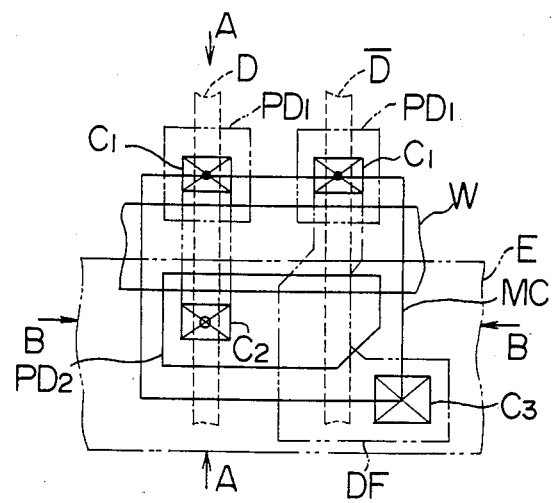
Figure 8C:
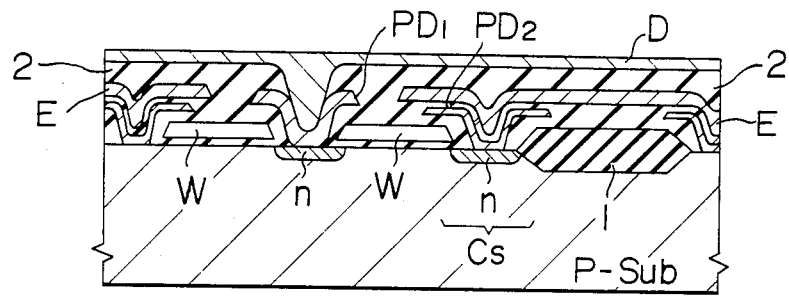
Figure 8D:
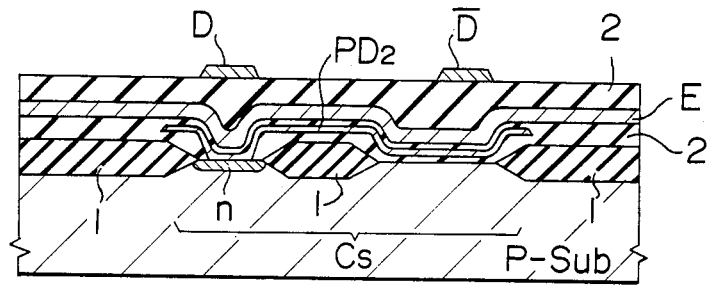

FIG. 8A is a circuit diagram of the embodiment, FIG. 8B is a plan view of the memory cell of FIG. 8A, FIG. 8C is a cross section of the memory cell along A—A of FIG. 8B, and FIG. 8D is a cross section of the memory cell along B—B of FIG. 8B.

Symbols used in FIGS. 8A to 8D have the following meanings:
E: electrode,
$P_{D1}$: pad for data line (same layer as E),
$P_{D2}$: gate electrode of store transistor,
D, $\bar{D}$: pair of data lines.

Referring to FIG. 8C, the arrangement is also shown wherein electrode E and pad $PD_1$ at the interconnection between the memory cell and the data line are formed using a same mask. As compared with FIGS. 7A to 7C, electrode E can be made thicker to correspondingly realize low resistance. Therefore, as a material of electrode E, beside aluminum (VS) in the embodiment of FIGS. 7A to 7C, relatively high resistance material such as tungsten silicide, polycide or the like may be used. Further, since the layers $P_1$ and $P_2$ are made of different layers, they may be laid out nearer to correspondingly make the pitch in the word line direction shorter. Furthermore, the sectional structure is made flat to the degree that E and VS in FIG. 7 are connected in common so that high yield can be retained even with high minituarization.

FOURTH EMBODIMENT

The above embodiments have concerned about a 3T cell whose read and write word lines are connected in common. The memory cell of this type has a smallest area, but it has a somewhat narrow operating margin because of use of the word lines connected together. Memory cells whose word lines connected together are shown in FIGS. 9A and 9B.

Figure 9A:
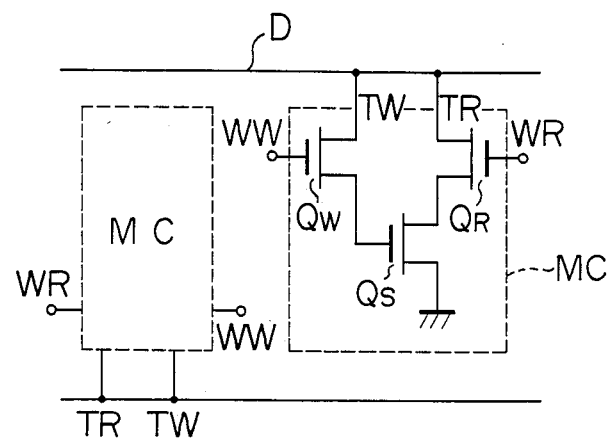
FIGS. 9A to 10B are views for illustrating a fourth embodiment of the present invention.
Figure 9B:
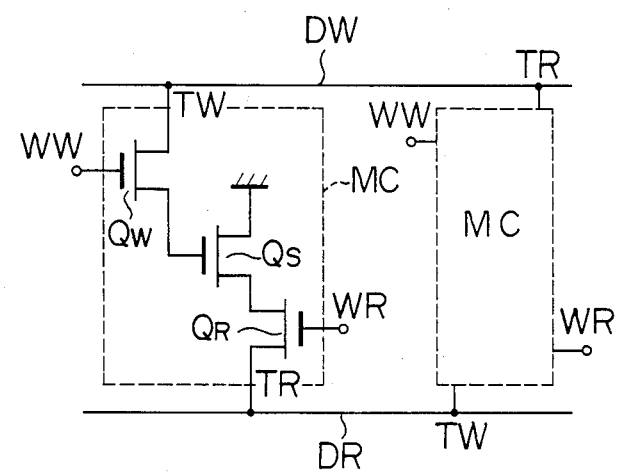

Symbols used in FIGS. 9A and 9B have the following meanings:
WW: write word line,
WR: read word line,
DW: write data line,
DR: read data line,
D: data line.

With these memory cells, after read word line WR is turned on and the memory cell is read, the word line is turned off and thereafter, write word line WW is turned on. Thus, read, write or rewrite operation is carried out. A memory cell having high performance can be obtained by applying the present invention to this type of cell. Particularly, it is very effective to employ the concept of connecting a pair of data lines so as to ensure electrical balance and arranging the sense amplifier, as shown in FIG. 2A. Obviously, the structure with an additional $C_S$ at the store node as shown with the second and third embodiments may be adopted.

Figure 10A:
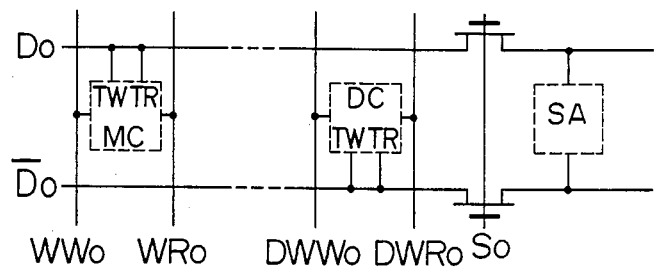
Figure 10B:
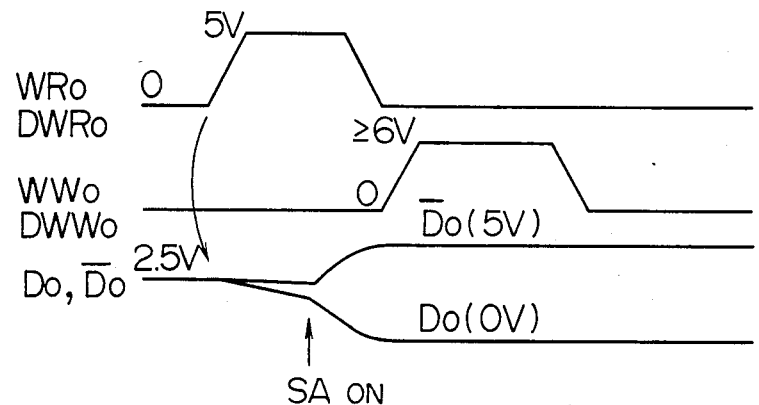

FIG. 10A is a more concrete circuit diagram of FIG. 9A, and FIG. 10B shows the operating waveforms in the circuit of FIG. 9A.

The operation with FIG. 10A is as follows. When word line $WR_o$ and dummy word line $DWR_o$ are turned on after precharging data lines $D_o$ and $\bar{D}_o$ to 2.5V, a small differential voltage appears on the pair of data lines $D_o$, $\bar{D}_o$ as previously described. Threafter, when sense amplifier SA is turned on after the transistors are turned on upon application of high level $S_o$ to transfer the information, the pair of data lines are amplified respectively to 5V and 0V (In FIG. 10B, data line $D_o$ is 5V and data line $\bar{D}_o$ is 0V. Since the gate of transistor $Q_S$ is 5V, it turns on so that the potential of data line $D_o$ drops through transistors $Q_R$ and $Q_S$). The succeeding operation is similar to that described previously.

FIFTH EMBODIMENT

A fifth embodiment of the present invention will be described hereinunder with reference to Figs. 11A to 11F.

Symbols used in Figs. 11A to 11F have the following meanings:
$W_o$, $W_1$: word (X) line,
$WC_o$, $WC_1$: capacitor driving line,
$DW_o$, $DW_1$: dummy word line,
MC: memory cell,
DC: dummy cell,
D, $\bar{D}$: pair of data lines,
SA: sense amplifier,
I/O, $\bar{I}/$ : common data input/output pair lines,
TV: power supply terminal,
TP: precharge terminal,
TR: memory cell read terminal,
TW: memory cell write terminal,
TA, TS: sense amplifier activation terminal,
TY: Y select terminal,
$Q_R$: read transistor,
$Q_S$: store transistor,
$Q_W$: write transistor,
$C_S$: capacitor,
$Q_P$, $Q_P'$: p-channel transistor,
$Q_N$, $Q_N'$: n-channel transistor,
$Q_Y$, $Q_Y'$: Y select transistor,
$N_S$: store node.

As well known, a memory array is constructed of plural pairs of data lines, although in the Figure only one pair of data lines are shown, plural word lines and matrix memory cells. Word lines ($W_o$, $W_1$) are selectively driven by an X address signal through an X decoder and word driver circuit. Capacitor driving lines ($WC_o$, $WC_1$ and so on) are similarly selected by the X address signal. A desired pair of data lines is selected by a Y decoder and Y driver circuit in a well known manner, the circuit being omitted in the Figure. A plurality of memory cells MC (in the Figure two cells are shown) are connected to a pair of data lines D and $\bar{D}$ while two pairs of dummy cells DC corresponding to odd and even number memory cells are connected thereto for supplying reference voltages. A pair of data lines is precharged through transistors to which precharge terminal TP and precharge power supply terminal TV are connected. A signal voltage outputted from a selected memory cell to a data line is differentially amplified by sense amplifier SA with reference to a voltage on the other data line. Thereafter, Y select terminal TY is selected to output the amplified voltage signal onto I/O pair lines as a data output. A write operation is conducted in a similar manner as conventional differential method, by applying a differential voltage corresponding to a data input to I/O pair lines.

The aspects of this embodiment resides in:
(1) A data line voltage is 1.5V at maximum which is considerably small as compared with conventional 4V to 5V. Nevertheless, a store voltage in the memory cell can be set at a high voltage of 3.5V which is the same order as conventional one.

(2) A plurality of 3T memory cells MCs are connected in such a manner that the parasitic capacitances of pairs of data lines (e.g., a pair of D, $\bar{D}$) are made balanced. In the Figure, read and write terminals TR and TW are separately connected in a cell to the pair of data lines. In addition, in view of that the electrical characteristics of TR and TW are not necessarily the same, read and write terminals TR and TW are alternately connected relative to a same pair of data lines. Each pair of data lines is provided with a differential sense amplifier SA in common with MCs. A signal voltage of MC read from one of the pair of data lines is amplified by sense amplifier SA using as a reference voltage the voltage on the other of the pair of data lines. If sense amplifier MC has a sufficient sensitivity, it becomes unnecessary to read MC for long time as shown in FIG. 1A, but a small read signal voltage can be amplified by the sense amplifier when it appears on the data line, thus correspondingly realizing high speed. As a means for generating a reference voltage, a dummy cell DC is provided.

Figure 11A:
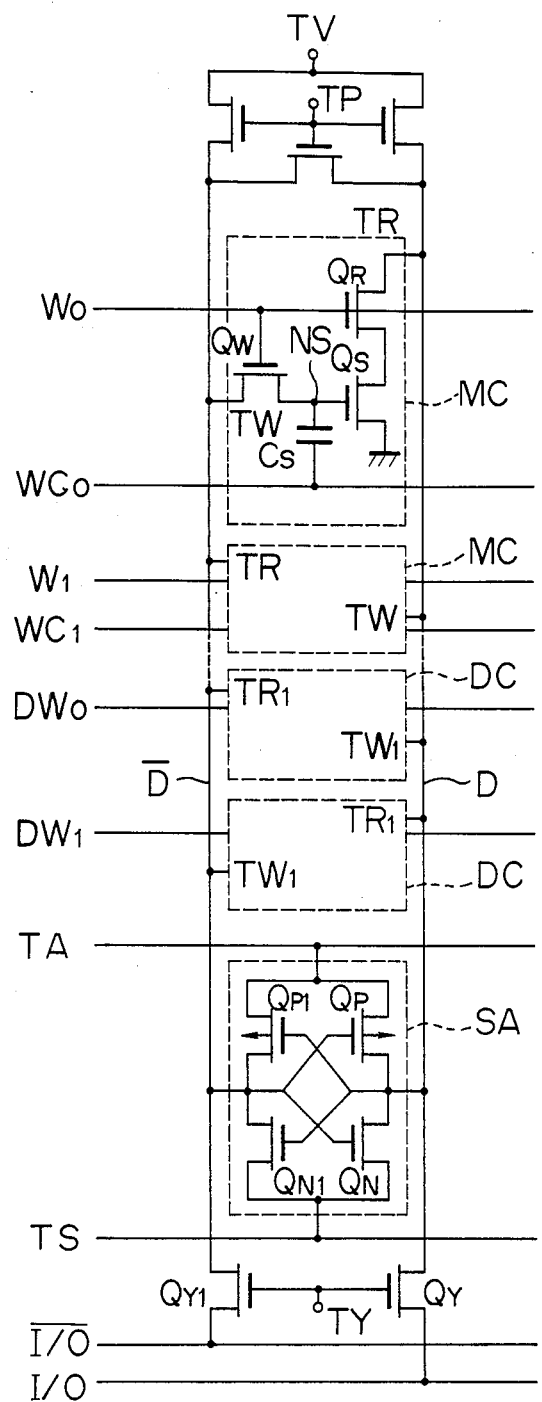
FIGS. 11A to 16 are views for illustrating a fifth embodiment of the present invention.
Figure 11B:
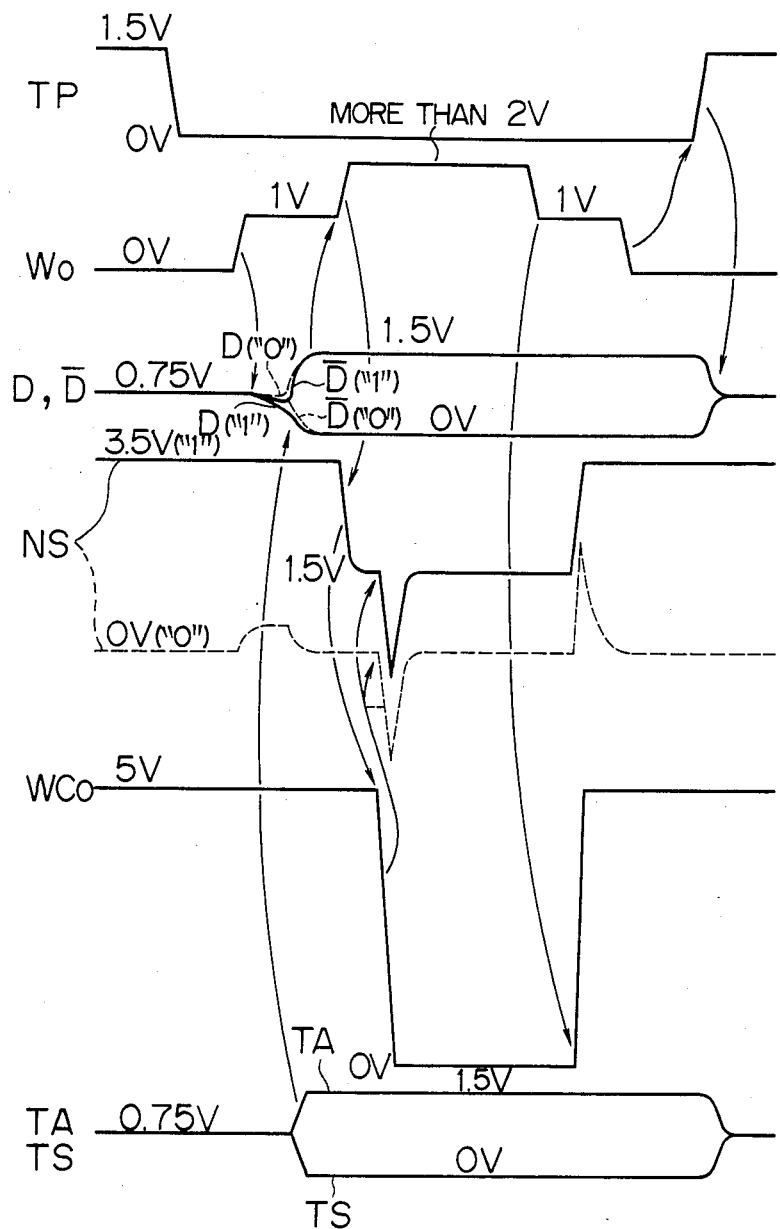

(3) Since the sense amplifier is constructed as a flip-flop composed of N-channel and P-channel transistors, the voltage levels on the pair of data lines are by all means in opposite phase at a fixed level. Therefore, current through transistors $Q_R$ and $Q_S$ during writing does not flow on condition that the read and write terminals are separately connected to the pair of data lines as shown in FIG. 11A, thus ensuring low power dissipation. In addition, since the data lines are not in floating state as conventional, a sufficient voltage level can be rewritten.

(4) The gate voltage of $Q_S$ are not reversed during reading and rewriting. This is because of separate connection of the read and write terminals to the pair of data lines.

(5) Since the precharge voltage of the data lines are almost the middle value between high and low write voltages to the memory cell, the voltage level for simultaneous charge/discharge becomes about the half of conventional one, thereby making the power dissipation during charge/discharge of the data lines about half of conventional one Further, by arranging the charge/discharge of the pair of data lines to be carried out substantially at the same time, it is possible to cancel out coupling voltage to other conductors such as word lines and silicon substrate to thereby realize low noise. In the following, the embodiment will be further described in detail with reference to the timing chart shown in FIG. 11B. Unless specifically stated, it is assumed that the threshold voltage of transistor is 0.5V.

Assume now that a word line $W_o$ and the memory cell connected thereto have been selected. When a pulse voltage of 1.5V having been applied to precharge terminal TP becomes turned off, each data line is precharged to 0.75V which is the voltage at precharge power supply terminal TV and thereafter, becomes floating state. After a voltage of 1V is applied to word line $W_o$ and dummy word line $DW_o$, a read operation starts. The word line voltage is regulated to a low value for the following reason. Namely, since the word line voltage is applied also to the gate of transistor $Q_W$, it is necessary to suppress a rise in the gate voltage of $Q_S$ which should essentially be 0V but instead will rise due to a current flowing from the data line D via $Q_W$ when the gate (NS) voltage of store transistor $Q_S$ is 0V (information "0"). Assume that the threshold voltage $V_T$ of transistor is 0.5V. If the word voltage is 1V, the gate voltage of $Q_S$ will rise from 0V to 0.5V. However, in this case, there is no fear of turning-on of $Q_S$ during a read operation because $V_T$ of $Q_S$ is also 0.5V. After the word voltage is applied as described above, and in case where the gate voltage of $Q_S$ in memory cell MC is 3.5V (information "1"), the data line D discharges toward 0V because $Q_S$ and $Q_R$ turn on, while the data line $\overline{D}$ also discharges by means of dummy cell DC to be described later. If the discharge speed by DC is set slower than that by MC using a means to be described later, a difference voltage between data lines D and $\overline{D}$ is produced which is inputted to sense amplifier SA. Thereafter, the flip-flop composed of N-channel transistors $Q_N$ and $Q_{NI}$ and amplifying in the discharge direction and the flip-flop composed of P-channel transistors $Q_P$ and $Q_{PI}$ and amplifying in the charge direction are activated upon application of pulses TS and TA. Thus, sense amplifier SA operates to charge $\overline{D}$ from about 0.75V to 1.5V, and to discharge D from about 0.75V to 0V. The amplified differential signal is differentially outputted upon Y selection (pulse application to TY) to I/O line to obtain a data output. Similarly, to read 0V (information "0") of the gate voltage of $Q_S$ of memory cell MC, data line D is maintained 0.75V because of a cut-off state of $Q_S$, while data line $\overline{D}$ discharges by means of dummy cell DC in the manner as described previously. Since the obtained differential signal is opposite in phase to that during reading "1", thus sense amplifier SA can correctly discriminate and amplify this signal. As above, by setting the discharge waveform of the data line by means of dummy cell DC at between two waveforms (a discharge waveform in case of "1", and a constant voltage of 0.75V in case of "0") of the data lines associated with the stored information in memory cell MC (idealistically at the midpoint waveform), sense amplifier SA can correctly amplify the differential signal corresponding to the stored information and produce a data output. The above operation is not possible unless the electrical characteristics of the pair of data lines, particularly of the parasitic capacitances of the pair of data lines, are maintained balanced. The reason for this is that although memory cell MC has a function of amplification, a small signal prior to sufficient amplification of the differential signal on the data lines is amplified at high speed by sense amplifier SA. To correctly detect the polarity of a small, differential signal corresponding to the stored information and amplify the signal, it is more desirable that the parasitic capacitances of the pair of data lines, which is a capacitive load when seen from the sense amplifier, be more completely balanced. To realize such balance, read and write terminals TR and TW are separately connected to the pair of data lines as shown in FIG. 11A, as compared with a conventional circuit interconnection within a memory cell (FIG. 1A). Further, according to the aspect of this embodiment, since the terminals TR and TW may have different characteristics of such as parasitic capacitance, the terminals connected to the pair of data lines are alternately changed for each memory cell to balance the parasitic capacitances of the pair of data lines.

After amplifying and fixing the data pair line voltages respectively at 0V and 1.5V, the word line voltage is raised to more than 2V. Thereafter, the capacitor electrode line $WC_o$ of the selected memory cell is changed from 5V to 0V. Consequently, the voltage at store node NS is forcibly fixed to the data line voltage to become 1.5V or 0V respectively for information "1" or "0". Assuming that the voltage at NS is subject to change by 2V through $C_S$ due to a voltage change on electrode line $WC_o$, the voltage at NS becomes $-0.5V$ or $-2V$ respectively for information "1" or "0". However, since the gate (word line) of $Q_W$ is more than 2V and the drain (data line) is either 1.5V or 0V, transistor $Q_W$ is turned on to retain 1.5V and 0V at NS. In case of a negative voltage of NS, a more negative voltage (e.g., $-3V$) is applied as a substrate bias voltage to the P-type Si substrate (FIGS. 11E, 11F) to eliminate the problem of interference to other cells or information damage. Next, the word voltage is again set at 1V and thereafter, $WC_o$ is raised from 0V to 5V. In this case, transistor $Q_W$ turns on for information "0" (NS is 0V), and turns off for information "1" (NS is 1.5V). Therefore, with information "0", although NS is raised to 2V at one time, it discharges to 0V because of a current flowing through sense amplifier SA via transistor $Q_W$. On the other hand, with information "1", NS remains raised to 3.5V. This store voltage is retained even when the word voltage becomes 0V.

In a write operation, during the period while SA turns on and during the period while $W_o$ is more than 2V, a differential voltage of 1.5V is forcibly applied to I/O pair lines, and the flip-flops of sense amplifier SA are set by the selected Y select transistors $Q_Y$, and $Q_{YI}$ in accordance with the input data.

As a result, one of the differential voltages 0V and 1.5V appearing on the pair of data lines D and $\overline{D}$ is inputted to the gate of $Q_S$ via $Q_W$ of memory chip MC to complete the write operation. Since the word voltage is more than 2V and the $V_T$ of $Q_W$ is 0.5V, 1.5V on the data line itself becomes the gate voltage of $Q_S$.

If D is at 1.5V, $\overline{D}$ is at 0V. Therefore, current does not flow through $Q_S$ and $Q_R$ as conventional. On the other hand, even if D is 0V and $\overline{D}$ is 1.5V, current does not flow through $Q_S$ and $Q_R$ because of a cut-off of $Q_S$, thus ensuring low power dissipation. This advantageous effect is originated from that the read and write terminals are separately connected to the pair of data lines operating differentially.

The other memory cells on word line $W_o$ must be rewritten, and this rewrite operation can be effected by inputting the voltage level amplified by the sense amplifier, at the time the word line is raised to more than 6V, to the gates of the memory cells $Q_S$. Similarly, it is obvious that when another word line, for example word line $W_l$, is selected, read and write operations can be effected selecting dummy word line $DW_l$.

FIGS. 11C to 11F are a circuit diagram and the plan and cross sections of a memory cell of the fifth embodiment of the present invention. Symbols used in the Figures have the following meanings:

MC: plan view corresponding to one memory cell,
D, $\overline{D}$: pair of data lines,
1: isolation layer
2: insulation layer
W: word line,
PD: pad,
DF: active region,
$C_S$: store capacitance (capacitor)
$W_C$: capacitor driving line
VS: earth (ground) line,
C1: contact for connecting n-layer and PD, and PD and D, $\overline{D}$,
C2: contact for connecting n-layer and PD,
C3: contact for connecting n-layer and VS.

Word line W is made of silicide or polycide containing polysilicon, molybdenum, or tungsten. Data line D is made of silicide or alminum. The data line and the n-layer outside of the memory cell is interconnected using PD made of polysilicon or the like. Ground line VS made of aluminum or silicide is connected to the n-layer at contact C3 portion. Capacitor electrode line WC may use aluminum, silicide, polycide or tungsten which is different material from line VS. The insulation layer for forming the capacitor may use a heat oxidized layer, a nitride layer, a tantalum pentoxide layer or a multi-layer thereof.

According to the present invention, the store voltage in the memory cell can be set as high as it does not give any problem of reliability such as with respect to soft error. Further, the data line voltage can also be set small independently of the store voltage. As a result, high reliability add low power dissipation can be advantageously realized.

The dummy cell and its driving method shown in FIGS. 3A and 3B of the first embodiment, wherein the voltage waveform of a dummy cell is set at between two voltage waveforms corresponding to store information "1" and "0" appearing on the pair of data lines during a read operation, may be applied to this embodiment. In this embodiment, the operation is carried out with the precharge voltage of 0.75V instead of 2.5V in FIG. 3B. FIG. 11A shows a dummy cell within which a transistor for supplying a precharge voltage is provided. As described previously, when a read or write operation is completed, 3.5V or 0V is rewritten or written to a selected memory cell. In this case, a voltage opposite in polarity to that of the memory cell is written in the dummy cell at the same time. The voltage to be written to the dummy cell is not always constant so long as a random access memory is used. However, it is necessary to always output a constant voltage waveform onto the data lines during a read operation. Thus, it becomes necessary to set an unstable gate voltage of $Q_{DS}$ prior to the reading operation at a constant voltage. This is accomplished by turning on $Q_{DS}$ through terminal TP1 during the precharge period to supply a certain constant voltage from terminal TV1 to store transistor $Q_{DS}$ of the dummy cell. For example, assume that the constant voltage is set at 1.75V which is a middle value between 0V and 3.5V of the gate voltages of $Q_S$ of the memory cell corresponding to $Q_{DS}$. Then, it is possible to set the data line waveform outputted to the data lines at between the data waveforms read from the memory cell if the sizes of dummy cell transistors are made substantially the same as those of corresponding memory cell transistors. This is illustrated in FIG. 3B wherein it is assumed that the sense amplifier is being turned off to emphasize the mutual relationship between data waveforms of the memory cell and the dummy cell. Obviously, the read waveform of the dummy cell can be controlled as desired by varying the amplitude of the constant voltage to be supplied from TV1 or by changing the size of transistor $Q_{DR}$ to change the conductance thereof. In the foregoing description, the threshold voltage $V_T$ of transistor has been assumed as constant, however $V_T$ of each transistor may be selectively changed to change its driving capability or conductance so as to achieve specific purpose. For example, the mutual relationship between data line voltage waveforms of the memory cell and the dummy cell can be controlled by setting $V_T$ of transistor in the dummy cell at a different one from that of the corresponding transistor in the memory cell, or by setting $V_T$ of transistors in the memory cell or the dummy cell at a different one from each other.

Figure 12A:
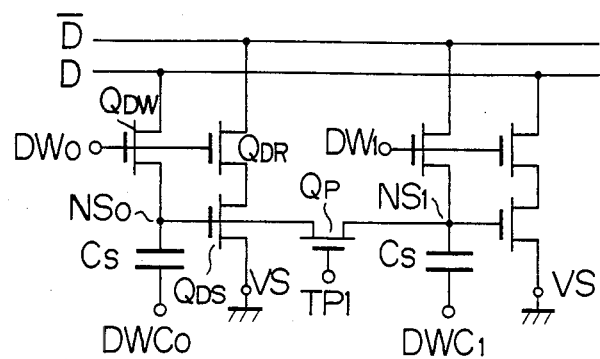
Figure 12B:
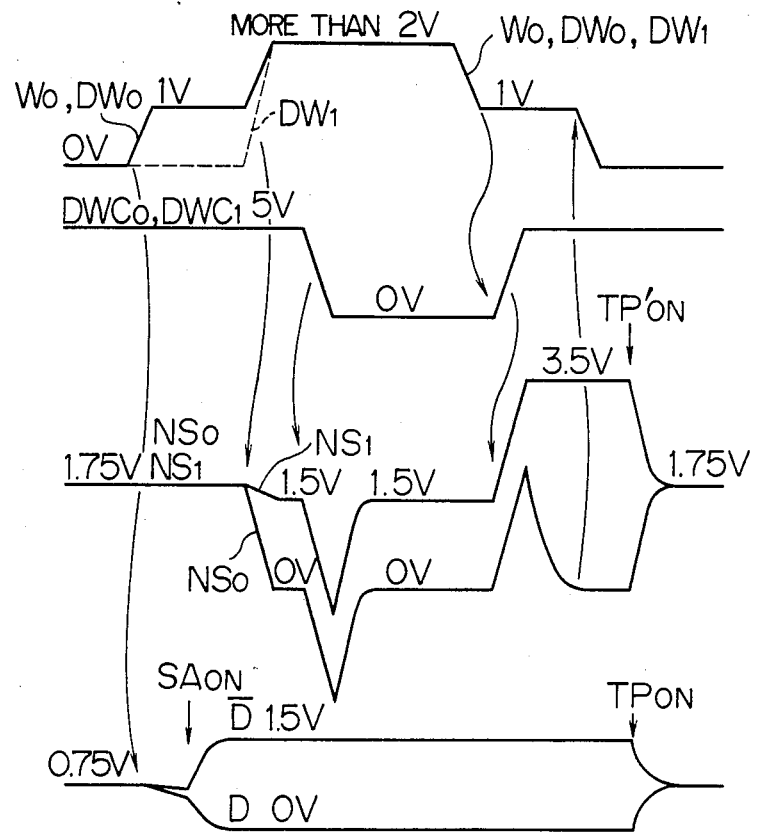

FIGS. 12A and 12B show an example wherein a cell having the same structure as the memory cell with an additional $C_S$ is used as dummy cell, with the exception that a precharge transistor is added to connect the store nodes of two dummy cells during a precharge period. In this example, two dummy cells are used for automatically generating a middle voltage without externally supplying the middle voltage of 1.75V as in the above-described dummy cell. Consider now that a dummy cell connected to $DW_o$ is selected and a reference voltage is generated onto data line $\overline{D}$. First, 1V is applied to selected dummy word line $DW_o$ similar to the case of a selected memory cell. Thereafter, the word lines and the capacitor driving lines of selected and non-selected dummy cells are simultaneously applied with pulse voltages. Similar to the operation of the above-described memory cell, the store nodes $NS_o$ and $NS_1$ of the two dummy cells are respectively fixed at 0V and 1.5V as shown in the Figure in case where the selected memory cell stores a high voltage (3.5V). When $DWC_o$ and $DWC_1$ are raised simultaneously from 0V to 5V, the voltages of $NS_o$ and $NS_1$ become 0V and 3.5V respectively. Thereafter, at the next precharge (turning-on of TP1), the both nodes become to have a same voltage of 1.75V. In case where a memory cell stores a low voltage (0V), $NS_o$ and $NS_1$ are reversed to have 3.5V and 0V respectively. However, in this case also, the both voltages have a same voltage of 1.75V after the precharge.

Figure 13:
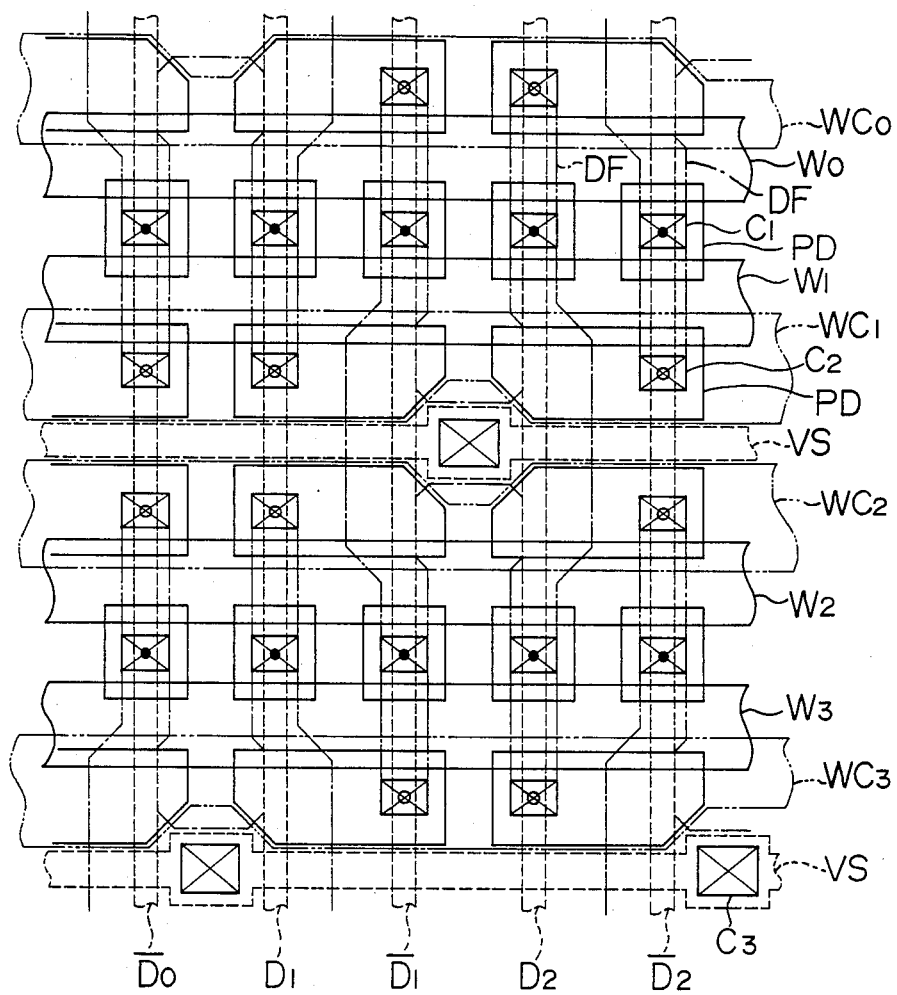

FIG. 13 shows a layout of a memory array using memory cells according to the invention and balancing the voltage characteristics of the pair of data lines.

In FIG. 11A, the sense amplifier has been constructed of N-channel and P-channel MOS transistors. However, the sense amplifier may be constructed of only P-channel MOS transistors $Q_P$ and $Q_{P1}$. Particularly, $Q_N$ and $Q_{N1}$ may be omitted if the layout area of sense amplifier SA is too large to be included within the memory cell layout pitch. The reason fo this is that the memory cell and the dummy cell have also the function of amplifying the data line, i.e., function of discharging. Namely, when the flip-flop composed of $Q_P$ and $Q_{P1}$ is turned on upon application of a pulse to TA after a small voltage signal is read onto the pair of data lines, the high voltage side data line D or $\overline{D}$ is charged from 0.75V to 1.5V by the sense amplifier, while the low voltage side data line D or $\overline{D}$ is discharged from about 0.75V to 0V by the memory cell or the dummy cell.

In the memory cell shown in FIG. 11A, the relationship between the word voltage (1.5V in FIG. 11A) during a read operation and the threshold voltage VT of transistor, particularly transistor $Q_W$, is very important with respect to the cell performance. If $V_T$ of $Q_W$ is selectively made high in a conventional memory cell of FIG. 1A, the gate voltage of $Q_R$ can be made high correspondingly thus enabling high performance. This is already known in JP-B-54-15652. Similarly, high performance can be achieved by incorporating this concept to $Q_W$ of the cell of FIG. 11A. If the substrate surface under the gate of $Q_W$, including the n-layer connection regions (FIGS. 11C and 11F) of $Q_W$ and $Q_S$, is selectively made high in density, for example, by implanting ion such as boron, $V_T$ of $Q_W$ can be selectively made high and the soft error due to alpha rays can be suppressed to low level. Further, in the memory cell shown in FIG. 1A, it is important how to control a difference voltage, between the word voltage during a read operation and $V_T$ of transistors constituting the memory cell, at a constant voltage. This is detailed in the paper of the Institute of Electronics and Communication Engineers of Japan, June, 1975, Vol. 58-C, No. 6, pp. 237 to 334. In this case, a word voltage may be generated by a read word voltage power supply provided within the chip which is not influenced by the external power supply, to thereby obtain a constant read word voltage. This read word voltage power supply is a kind of a voltage limiter circuit whose output voltage, i.e., a word voltage, is preferably compensated for a change of $V_T$ due to manufacture scattering, so that a difference between the read word voltage and $V_T$ becomes substantially constant irrespective of a change of the external power supply and manufacture scattering thereby enabling high performance. Such a voltage limiter circuit is detailed in the Applications described previously.

Further, in this embodiment, the pulse voltage applied to $WC_o$ and the voltage coupled to the store node have been assumed as 5V and 2V respectively. In practice, the voltage coupled to the store node is determined based on the pulse voltage amplitude, the value $C_S$, the parasitic capacitance of the store node, and the $Q_S$ gate capacitance value. Therefore, a desired coupling voltage can be obtained by properly selecting these values.

The above embodiments have concerned about a 3T cell whose read and write word lines are connected in common. The memory cell of this type has a smallest area, but it has a somewhat narrow operating margin because of use of the word lines connected together. The embodiment wherein word lines connected together is shown in FIGS. 6A and 6B. With these memory cells, after read word line WR is turned on and the memory cell is read, the word line is turned off and thereafter, write word line WW is turned on. Thus, read, write or rewrite operation is carried out. A memory cell having high performance can be obtained by applying the present invention to this type of cell. Particularly, it is very effective to employ the concept of connecting a pair of data lines so as to ensure electrical balance and arranging the sense amplifier, as shown in FIG. 11A.

Figure 14A:
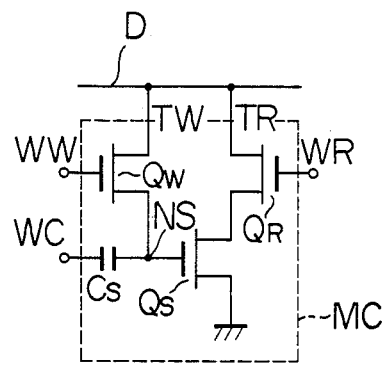
Figure 14B:
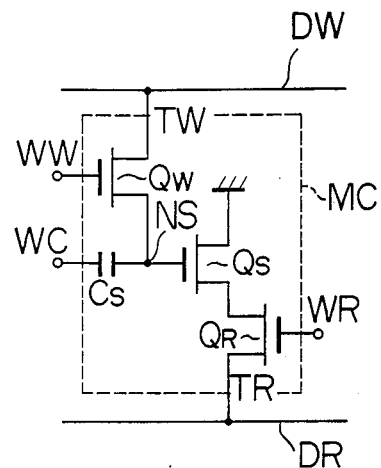
Figure 16:
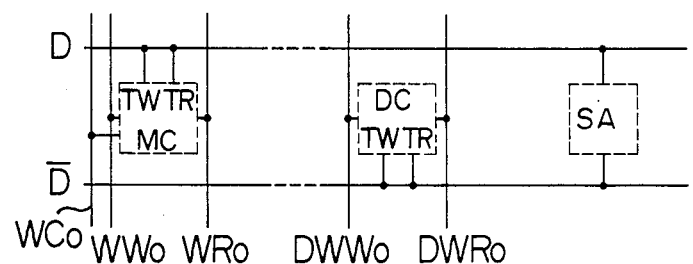
Figure 15:
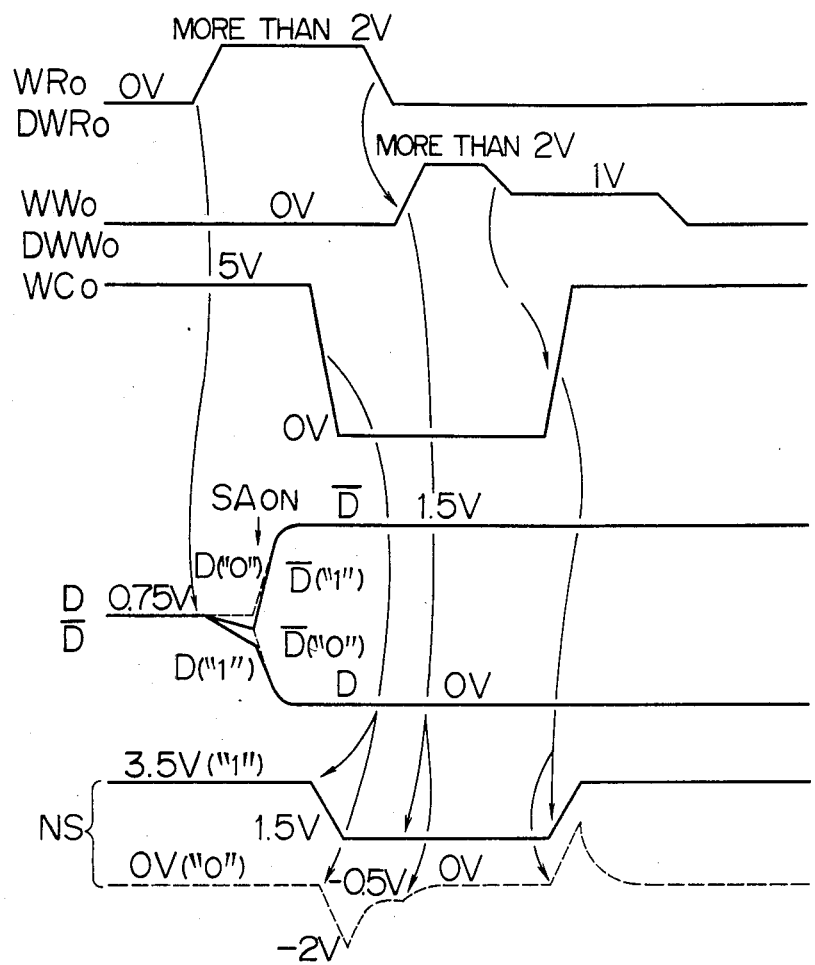

FIG. 15 illustrates the operation of a memory cell of FIG. 14B to which the present invention is applied. A pair of data lines D and $\overline{D}$ are connected having a memory cell arrangement to be described later, so that the electrical characteristics of DW and DR become balanced. For the simplicity of description, it is assumed that the threshold voltage of transistor is 0.5V. The operation thereof is essentially the same as with FIG. 11A. Write word line $WW_o$ is turned on after read word line $WR_o$ is turned off in the Figure. However, since a pair of data lines always operate differentially, $WR_o$ may continue turned on until $WW_o$ becomes turned off. The reason is that even if $WR_o$ is turned on, $Q_R$ and $Q_S$ will not turn on, thus ensuring low power dissipation. In this case, a cycle period is shortened since the operating timing margin between WR and DR is not needed. A dummy cell having a circuit arrangement as shown in FIGS. 3A and 12A is applicable also to this embodiment.

A memory cell shown in FIG. 14A to which the present invention is applied differs in that a store voltage is reversed at each read operation and the store node is rewritten. However, the essential operation thereof is the same as with FIG. 11A. That is, assume that a memory cell connection shown in FIG. 8 is employed. When a memory cell is read by turning on $WR_o$ at a high voltage of 3.5V at NS, data line D discharges to 0V via sense amplifier SA whereas $\overline{D}$ charges to 1.5V. Thereafter when $WR_o$ is turned off and $WW_o$ is turned on (more than 2V in amplitude) after lowering $WC_o$ from 5V to 0V, NS discharges to 0V, which is the data line voltage, and is fixed thereat. The succeeding operation is similar to that with FIG. 15. As compared with the memory cell of FIG. 14B, this memory cell can be made smaller because the data line is commonly used for both read and write operations. However, it is necessary to turn on $WW_o$ after turning off $WR_o$, thus resulting in a slightly long cycle period. The reason is that if a high voltage is applied to the data line while $WR_o$ and $WW_o$ are both turning on, a current flows through $Q_R$ and $Q_S$, thereby increasing power dissipation.

SIXTH EMBODIMENT

FIGS. 17A to 17F show examples of memory cell interconnection which balances the electrical characteristics of a pair of data lines D and $\overline{D}$ and is applicable to various 3T cells described so far. In an interconnection method of FIG. 17A, read and write terminals TR and TW in a memory cell are connected together to a same data line, and connected to each of a pair of data lines D and $\overline{D}$ alternately for each memory cell. In a method of FIG. 17B, interconnection to a pair of data lines is effected in units of a plurality of memory cells. In a method of FIG. 17C, TR and TW within a memory cell are respectively connected to a pair of data lines. In a method of FIG. 17D, interconnection to a pair of data lines is effected in units of a plurality of memory cells, with TR and TW within a memory cell respectively connected to a pair of data lines (corresponding to FIGS. 6 and 13). In a method of FIG. 17E, a pair of data lines are crossed once. In a method of FIG. 17F, a pair of data lines are crossed three times. Similar effects can be obtained by crossing even number times. These interconnection methods are not limited to a 3T dynamic memory cell, but any memory cell having read and write terminals may be connected to a pair of data lines to balance the electrical characteristics and achieve the same objects of the present invention.

Further, although a sense amplifier is provided for each pair of data lines, this amplifier for each pair may be omitted and a common differential sense amplifier may be provided instead at I/O lines, if the memory cells and dummy cells perform function of amplification. In this case, the chip size is advantageously reduced.

According to the present invention, a memory can be realized which has high speed, high density, low power dissipation, and high signal to noise ratio.

It is further understood by those skilled in the art that the foregoing description is a preferred embodiment of the disclosed device and that various changes and modifications may be made in the invention without departing from the spirit and scope of thereof.

I claim:

1. A dynamic random access memory including a plurality of pairs of data lines, a plurality of word lines intersecting the data lines, a plurality of memory cells each one having a read terminal, a write terminal and a gain function, and a common data line connected to the data lines, wherein:

said plurality of memory cells are connected to said plurality of pairs of data lines each respective pair of data lines being associated with a plurality of memory cells arranged in such a manner that the electrical characteristics of each pair of data lines are substantially balanced; and each pair of data lines receive differential signals.

2. A dynamic random access memory according to claim 1, wherein a sense amplifier for performing differential amplification is provided for each pair of data lines.

3. A dynamic random access memory according to claim 2, wherein said sense amplifier is constructed of a p-channel MOS transistor and an n-channel MOS transistor.

4. A dynamic random access memory according to claim 3, wherein said sense amplifier is comprised of a cross-coupled arrangement of CMOS logic inverting circuits for effecting sensing amplification and active restore operation and wherein said memory further includes a precharge circuit.

5. A dynamic random access memory according to claim 4, wherein said sense amplifier is coupled to an associated pair of data lines via selection switch and to input/output lines via another switch.

6. A dynamic random access memory according to claim 1, wherein a pair of data lines are provided with a dummy cell electrically connected thereto, said dummy cell being connected to a data line different from the other data line to which said read terminal of a selected memory cell among said memory cells is electrically connected, and outputting substantially middle value information between two value information of said memory cell.

7. A dynamic random access memory according to claim 1, wherein said data lines, word lines and memory cells constitute a memory mat, and two or more memory mats are provided.

8. A dynamic random access memory according to claim 1, wherein each one of said memory cells comprises a read transistor, a write transistor and a store transistor, said plurality of word lines comprising a plurality of read word lines and write word lines, and wherein:

one of the source or drain of said read transistor is electrically connected to one of a pair of data lines, the other of the source or drain is electrically connected to one of the source or drain of said store transistor, and the gate electrode is electrically connected to a word line;

one of the source or drain of said write transistor is electrically connected to the gate electrode of said store transistor, the other of the source or drain is electrically connected to the other one of said pair of data lines, and the gate electrode is electrically connected to a write word line; and the other of the source or drain region of said store transistor is connected to ground.

9. A dynamic random access memory according to claim 8, wherein said read and write word lines are connected together, and wherein the sources or drains of said write and read transistors of a memory cell are respectively connected to said one and said other of said pair of data lines, whereas the source or drains of said write and read transistors of an immediately adjacent memory cell associated with said pair of data lines are respectively connected to said other and said one of said pair of data lines.

10. A dynamic random access memory according to claim 8, wherein said plurality of pairs of data lines are comprised of at least aluminum, and which is provided with a buffer layer including polysilicon at an electrical connection portion to said read or write transistor.

11. A dynamic random access memory according to claim 1, wherein said plurality of word lines are comprised of polysilicon or silicide including polysilicon and other metal.

12. A dynamic random access memory according to claim 1, wherein each pair of said plurality of pairs of data lines are crossed.

13. A dynamic random access memory according to claim 1, wherein each pair of said plurality of pairs of data lines are precharged to a potential approximately halfway between two information potentials of a memory cell, prior to reading the memory cell information.

14. A dynamic random access memory aocording to claim 1, wherein said pairs of data lines selectively receive differential signals.

15. A dynamic random access memory according to claim 14, wherein said differential signals correspond to logic complement signals.

16. A dynamic random access memory according to claim 1, wherein said plurality of pairs of data lines are comprised of at least aluminum.

17. A dynamic random access memory including respective pairs of data lines, a plurality of word lines intersecting the data lines, memory cells provided at intersection points between the word lines and the data lines, and a sense amplifier for performing differential amplification is provided across each respective pair of data lines, said plurality of word lines being comprised of a plurality of read word lines and write word lines wherein:

each one of said memory cells comprises a read transistor, a write transistor and a store transistor, and wherein:

one of the source or drain of said write transistor is electrically connected to one of a pair of data lines, the other of the source or drain is electrically connected to the gate electrode of said store transistor, and the gate electrode is electrically connected to a write word line;

one of the source or drain of said read transistor is electrically connected to the other of said pair of data lines, the other of the source or drain is electrically connected to one of the source or drain of said store transistor, and the gate electrode is electrically connected to a read word line;

the other of the source or drain of said store transistor is electrically connected to a power supply terminal; and one end of a capacitor element is coupled to the other of the source or drain of said write transistor and to the gate electrode of said store transistor.

18. A dynamic random access memory according to claim 17, wherein a capacitor driving line is electrically connected to the other end of said capacitor element.

19. A dynamic random access memory according to claim 18, wherein said capacitor driving line is selectively driven by an address.

20. A dynamic random access memory according to claim 18, wherein high and low potentials are applied to said capacitor driving line to be driven after said sense amplifier operates.

21. A dynamic random access memory according to claim 19, wherein said pair of data lines are crossed.

22. A dynamic random access memory according to claim 19, wherein said pair of data lines are precharged to an approximately middle potential between two information potentials of a memory cell, prior to readng the memory cell information.

23. A dynamic random access memory according to claim 17, wherein said sense amplifier is constructed of p-channel MOS transistor and an n-channel MOS transistor.

24. A dynamic random access memory according to claim 17, further comprising dummy cells having an approximately middle value information between two value information of a memory cell are arranged across each of said respective pairs of data lines.

25. A dynamic random access memory according to claim 17, wherein said read and write word lines are connected together, and wherein the sources or drains of said write and read transistors of a memory cell are respectively connected to said one and said other of said pair of data lines, whereas the sources or drains of said write and read transistors of an adjacent memory cell associated with said pair of data lines are respectively connected to said other and said one of said pair of data lines.

26. A dynamic random access memory according to claim 17, wherein each of said pair of data lines contains at least aluminum, and is provided with a buffer layer including polysilicon at an electrical connection portion to said read or write transistor.

27. A dynamic random access memory according to claim 17, wherein each of said word lines contains polysilicon or silicide including polysilicon and other metal.

28. A dynamic random access memory according to claim 17, wherein said sense amplifier is comprised of a cross-coupled arrangement of CMOS logic inverting circuits for effecting sensing amplification and active restore operation and wherein said memory further includes a precharge circuit.

29. A dynamic random access memory according to claim 28, wherein said sense amplifier is coupled to an associated pair of data lines via selection switch and to input/output lines via another switch.

30. A dynamic random access memory according to claim 28, wherein said capacitor has a second end coupled to receive a voltage level intermediate the high and low data signals provided by said sensing amplifier.

31. A dynamic random access memory including a plurality of data lines arranged as a plurality of individual pairs of data lines receiving differential data signals and a plurality of three transistor type memory cells, each memory cell having a gain function, a read terminal and a write terminal coupled to respective read/write word lines crossing said plurality of data lines, said plurality of data lines being selectively coupled to a common inout/output data line, and
wherein said plurality of memory cells are arranged into individual rows of a plurality of memory cells coupled between the respective data lines of a corresponding data line pair, each memory cell including a series arrangement of a read transistor, having a control electrode coupled to a word line, and a store transistor coupled between one of said pair of data lines and ground and a write transistor coupled between one of said pair of data lines and a control electrode of said store transistor, said write transistor having a control electrode coupled to a respective word line and wherein adjacent memory cells in each respective row having the series connection of said read and store transistors between different ones of said pair of data lines and ground in a manner to substantially balance the electrical characteristics in each respective pair of data lines.

32. A dynamic random access memory according to claim 31, wherein each memory cell write transistor being coupled between one of said pair of data lines and the control electrode of said store transistor and said read and store transistor series connection being coupled from the other of said pair of data lines and ground.

33. A dynamic random access memory according to claim 32, wherein said read, write and store transistors are MOS transistors of the same channel conductivity type, said series connection being a series connection of the channels of said read and store transistors.

34. A dynamic random access memory according to claim 31, wherein each memory cell write transistor being coupled between one of said pair of data lines and the control electrode of said store transistor and said read and store transistor series connection being coupled from the same one of said pair of data lines and ground.

35. A dynamic random access memory according to claim 34, wherein said read, write and store transistors are MOS transistors of the same channel conductivity type, said series connection being a series connection of the channels of said read and store transistors.

36. A dynamic random access memory according to claim 31, wherein said read, write and store transistors are MOS transistors of the same channel conductivity type, said series connection being a series connection of the channels of said read and store transistors.

37. A dynamic random access memory according to claim 36, wherein said memory cell further includes a storage capacitor coupled on one side to the gate of said store MOS transistor.

38. A dynamic random access memory according to claim 37, wherein said capacitor has a second side coupled to an address driving line.

39. A dynamic random access memory according to claim 37, wherein said capacitor has a second side biased by a predetermined voltage level corresponding to a value intermediate high and low memory data signals.

40. A dynamic random access memory according to claim 31, further including a sense amplifier having sensing and active restore circuits provided for each pair of data lines, said sense amplifier selectively coupled to either a first group of memory cells of a respective pair of data lines or a second group of memory cells of said respective pair of data lines.

41. A dynamic random access memory according to claim 40, further including a precharging circuit coupled across each pair of data lines.

42. A dynamic random access memory according to claim 40, wherein each row of said memory cells includes at least a pair of dummy cells having the same configuration as said memory cells.

* * * * *